US006392567B2

(12) United States Patent
Satoh

(10) Patent No.: US 6,392,567 B2
(45) Date of Patent: May 21, 2002

(54) APPARATUS FOR REPEATEDLY COMPRESSING A DATA STRING AND A METHOD THEREOF

(75) Inventor: Noriko Satoh, Kawasaki (JP)

(73) Assignee: Fijitsu Limited, Kawasaki (JP)

( * ) Notice: Subject to any disclaimer, the term of this patent is extended or adjusted under 35 U.S.C. 154(b) by 0 days.

(21) Appl. No.: 09/765,421

(22) Filed: Jan. 22, 2001

(30) Foreign Application Priority Data

Mar. 31, 2000 (JP) ....................................... 2000-098834

(51) Int. Cl.7 ............................ H03M 7/34; H03M 7/38
(52) U.S. Cl. .............................................. 341/51; 707/7
(58) Field of Search ............................. 341/51, 50, 87, 341/106; 707/7

(56) References Cited

U.S. PATENT DOCUMENTS 4,888,645 A * 12/1989 Mitchell et al. ............ 358/261
5,051,745 A 9/1991 Katz ........................... 341/51
5,278,987 A * 1/1994 Chiang et al. ................. 707/7
5,600,316 A * 2/1997 Moll ........................... 341/87
5,635,932 A * 6/1997 Shinagawa et al. ........... 341/51
5,710,919 A * 1/1998 Rail ........................... 707/101
6,094,647 A * 7/2000 Kato et al. ...................... 707/2

OTHER PUBLICATIONS

Salomon, D., "Data Compression, The Complete Reference," Ch. 3, Dictionary Methods, pp. 144–147.

Yokoo, H., "An Improvement of Dynamic Huffman Coding with a Simple Repetition Finder," IEEE Transactions on Communications, vol. 39, No. 1, Jan. 1991, pp. 8–10.

* cited by examiner

*Primary Examiner*—Peguy JeanPierre
(74) *Attorney, Agent, or Firm*—Staas & Halsey

(57) ABSTRACT

A character string of which a start point is each address of character string data in an input buffer is rearranged in the predetermined order, so that a rank list is generated. Next, the location of the matching candidate of a character string to be encoded is obtained on the basis of the rank list. Then, the character string to be encoded is compared with a matching candidate, thereby obtaining a matching length. Further, a code is generated using the location of the matching candidate and the matching length, and the code is output as compression data.

16 Claims, 23 Drawing Sheets

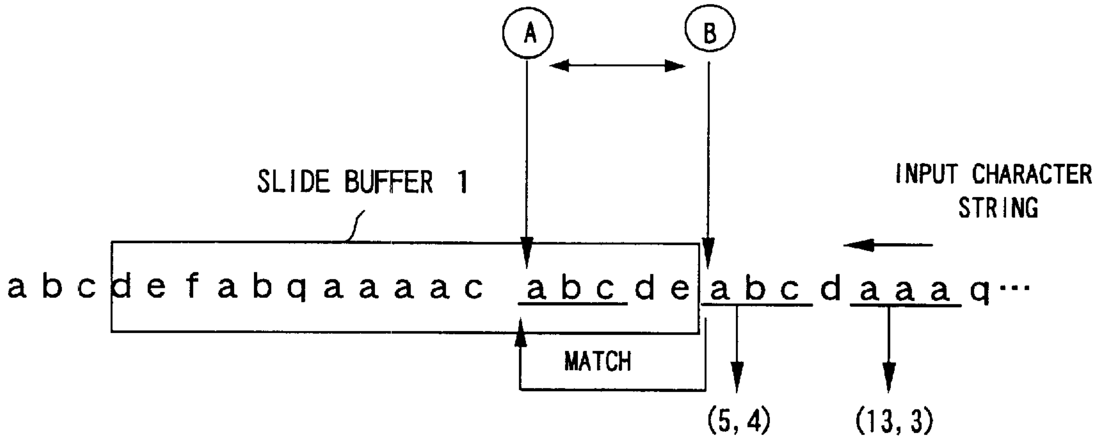
F I G. 1 A

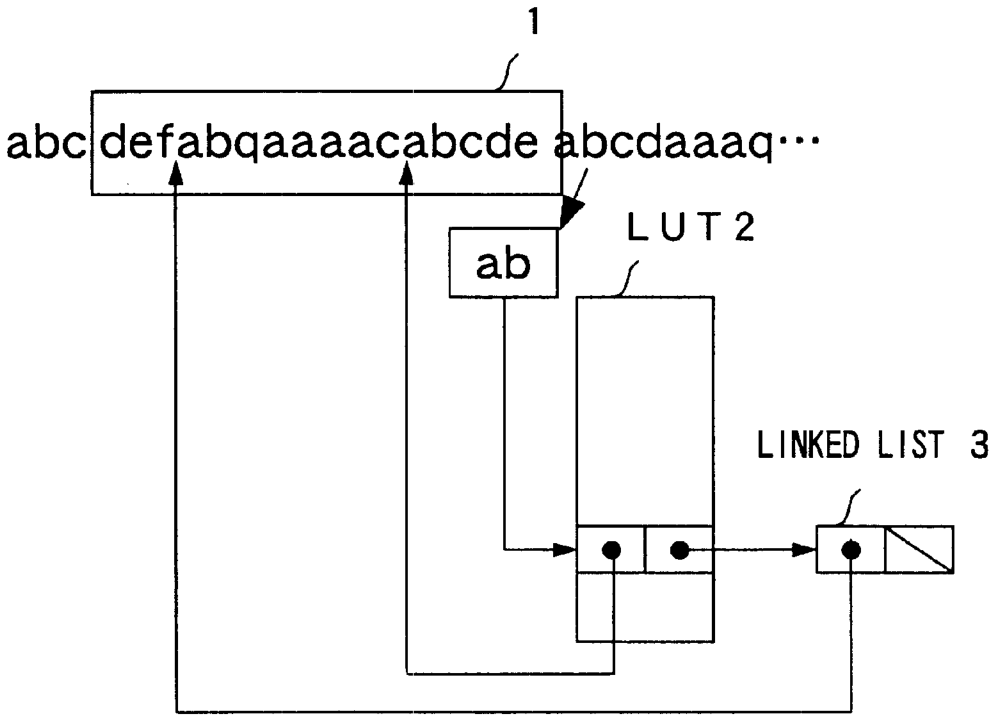
F I G. 1 B

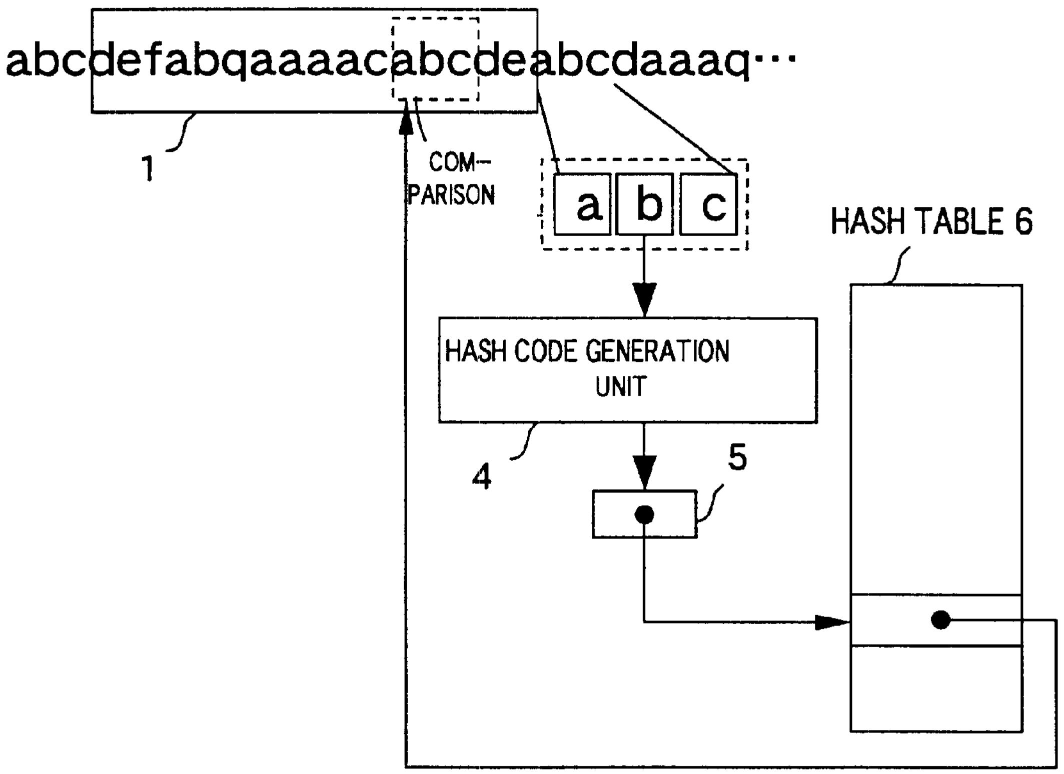
F I G. 1 C

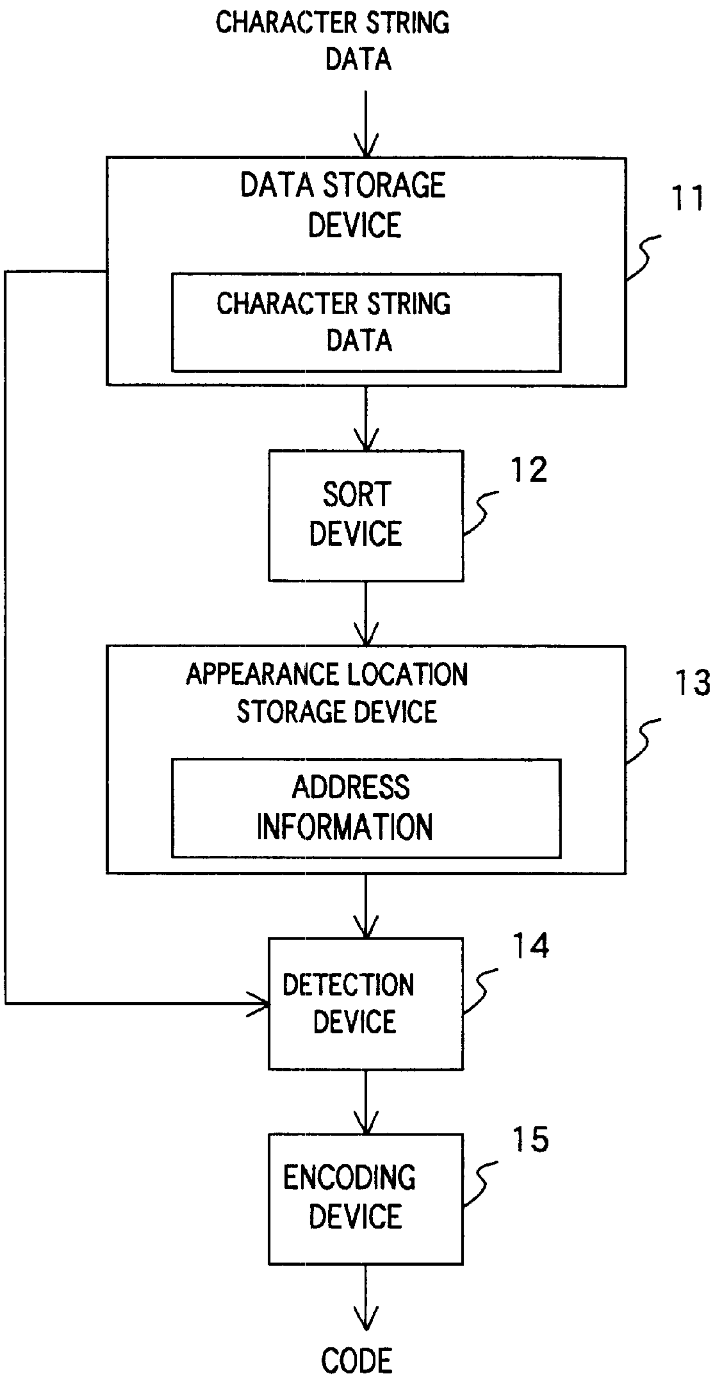
F I G. 2 A

| ADDRESS | |
|---|---|
| 1 | c |
| 2 | o |
| 3 | m |
| 4 | p |
| 5 | r |
| 6 | e |
| 7 | s |
| 8 | s |
| 9 | i |
| 10 | o |
| 11 | n |
| 12 | |
| 13 | d |
| 14 | e |
| 15 | c |
| 16 | o |
| 17 | m |
| 18 | p |
| 19 | r |
| 20 | e |
| 21 | s |
| 22 | s |
| 23 | |
| 24 | c |
| 25 | o |
| 26 | m |
| 27 | p |
| 28 | r |
| 29 | e |
| 30 | s |
| 31 | s |
| 32 | i |
| 33 | o |
| 34 | n |

F I G. 2B

| | | |
|---|---|---|
| 1 | 1 | com |
| 2 | 2 | omp |
| 3 | 3 | mpr |
| 4 | 4 | pre |
| : | : | |
| 31 | 31 | sio |
| 32 | 32 | ion |
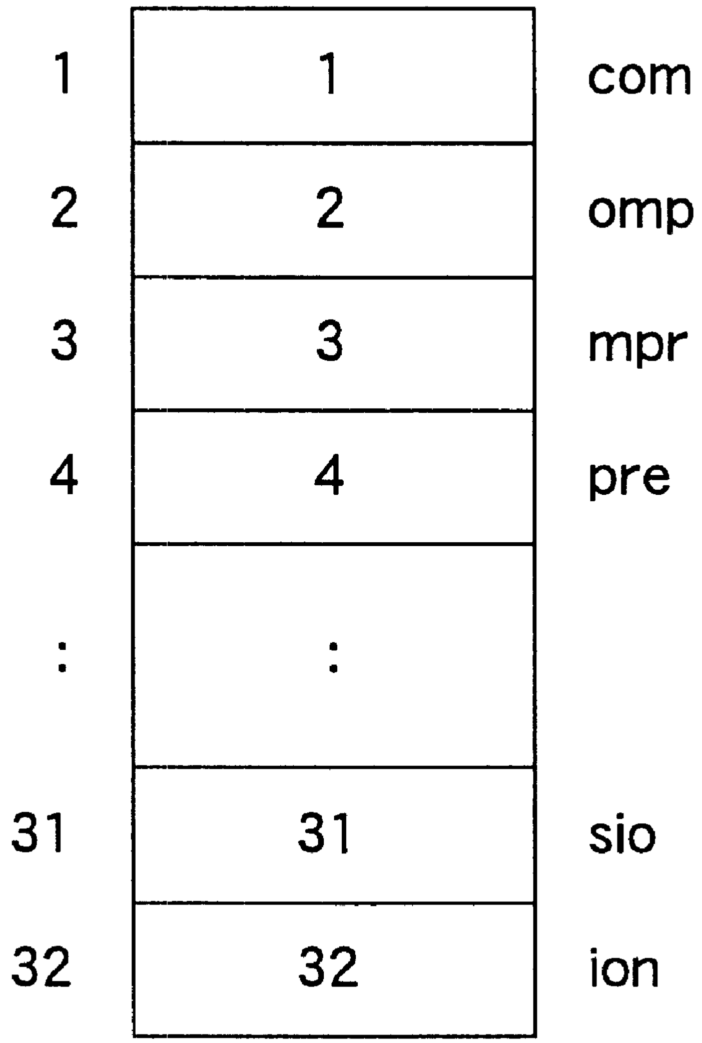
F I G. 3

| | | |
|---|---|---|
| 1 | 23 | __co |
| 2 | 12 | __de |
| 3 | 1 | com |
| 4 | 15 | com |
| 5 | 24 | com |
| : | : | |
| 31 | 7 | ssi |
| 32 | 30 | ssi |

F I G. 4

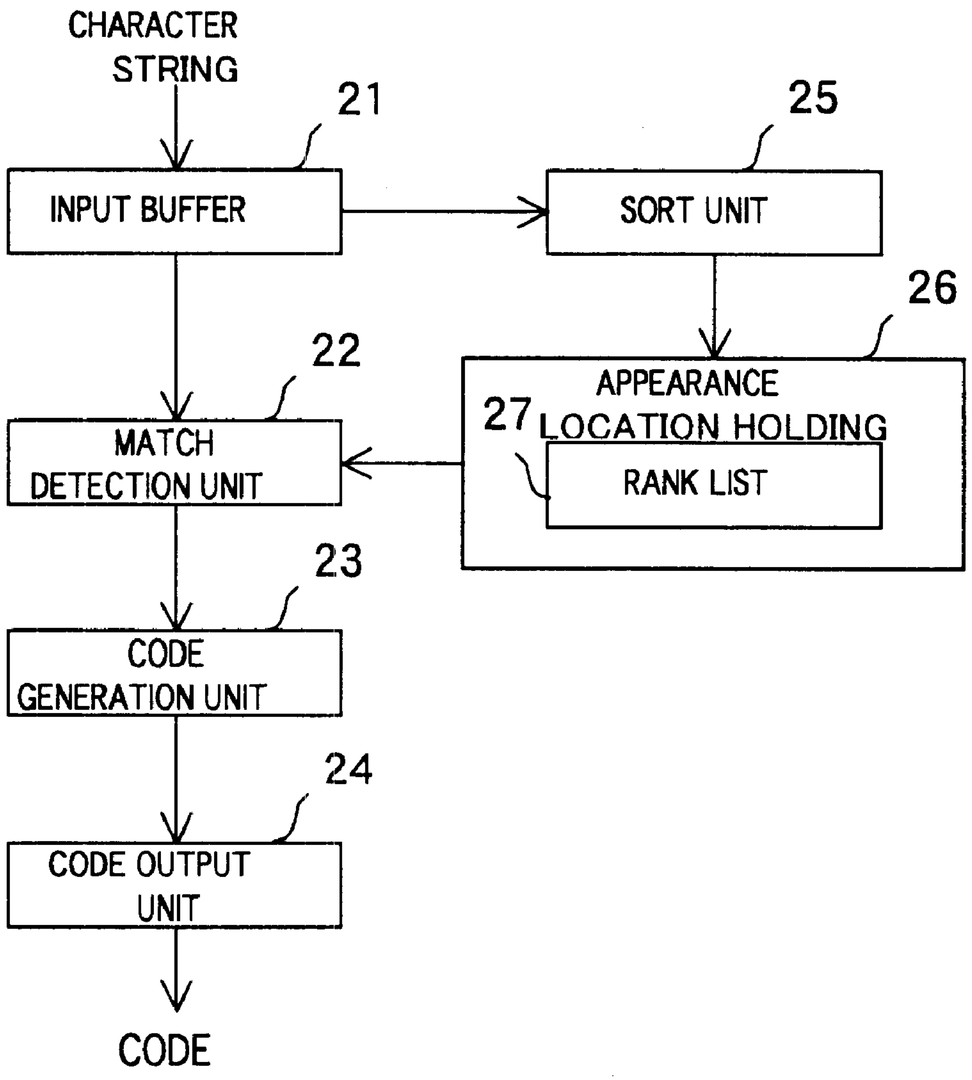
F I G. 5

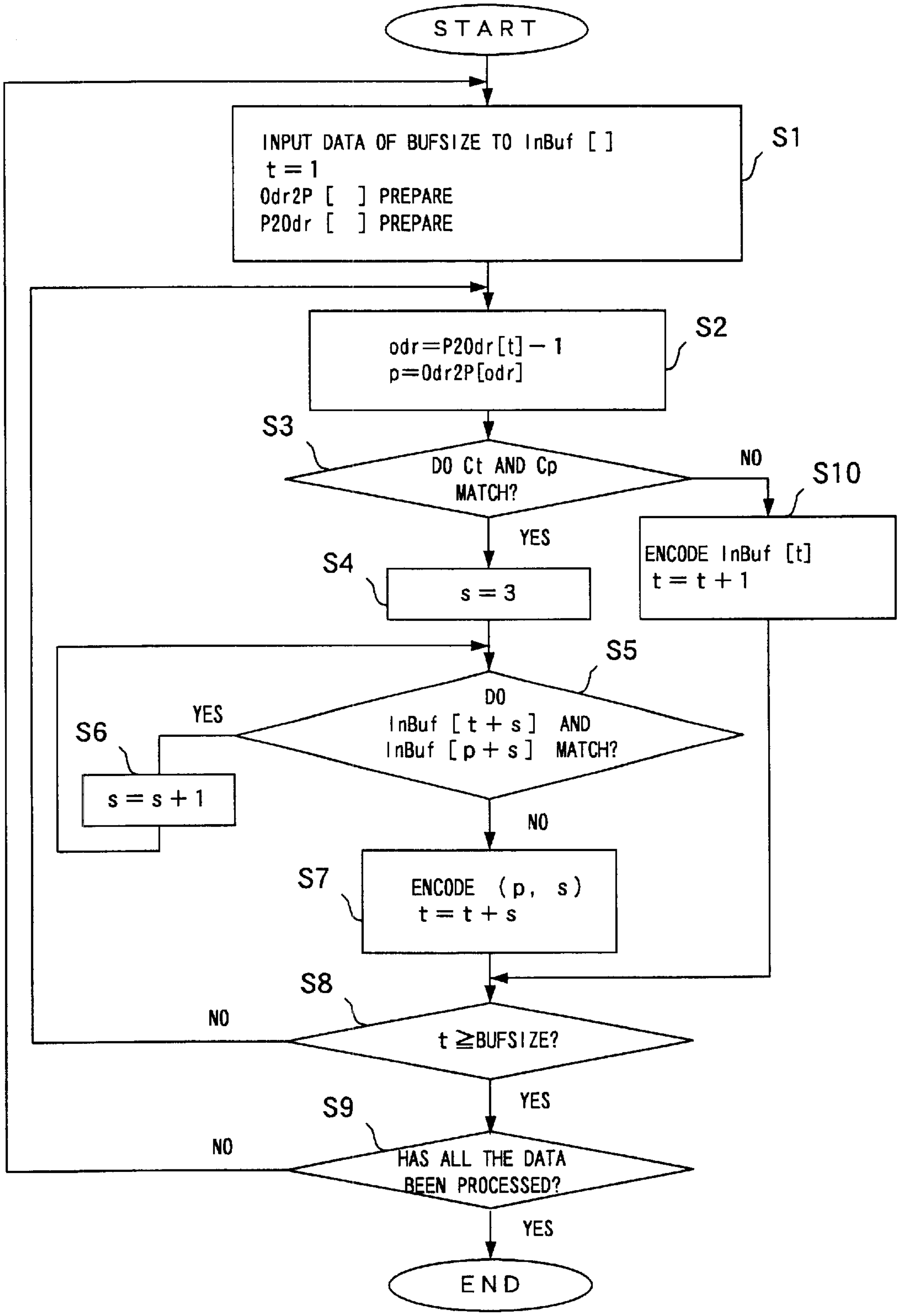
F I G. 8

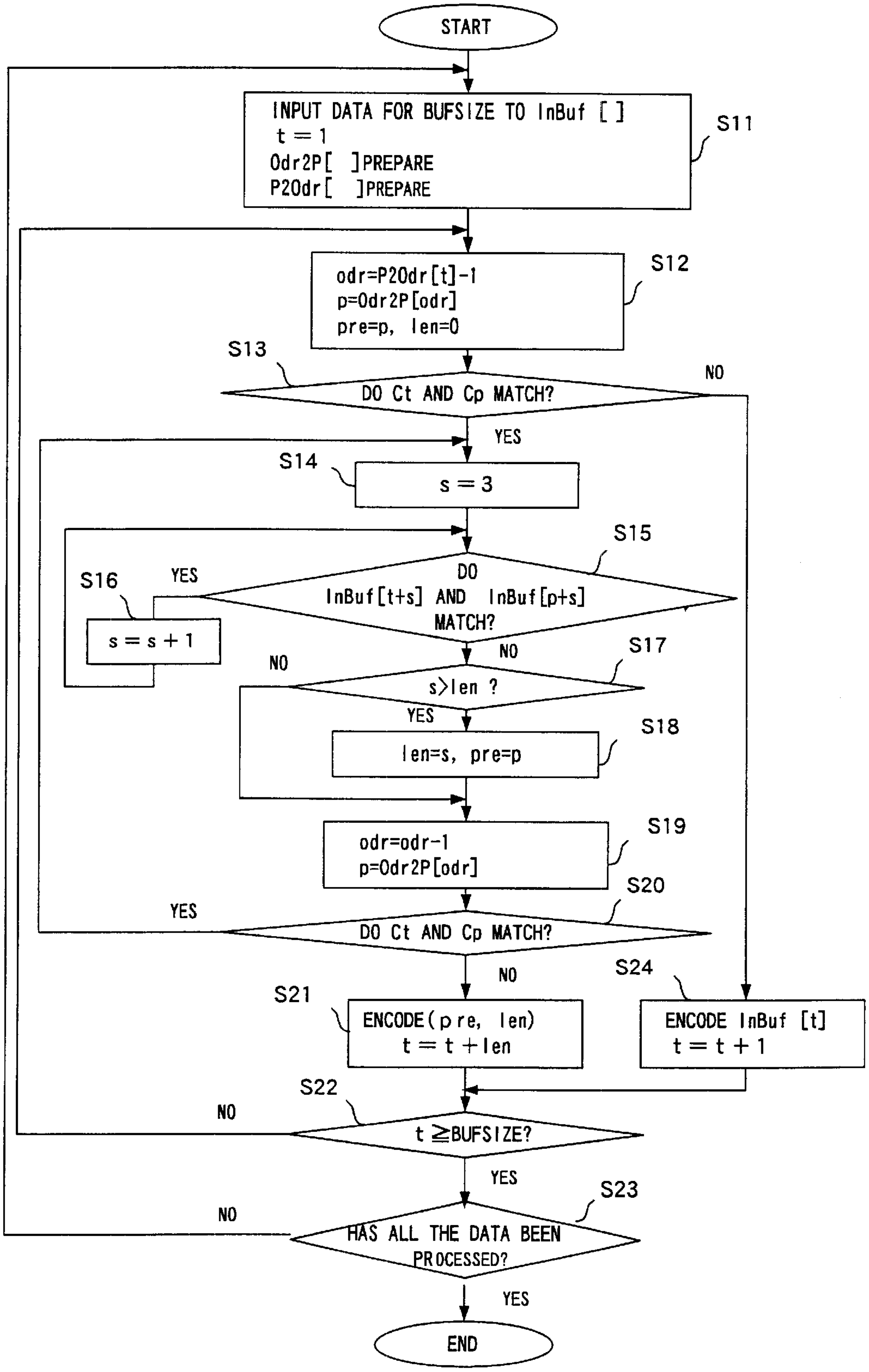
F I G. 9

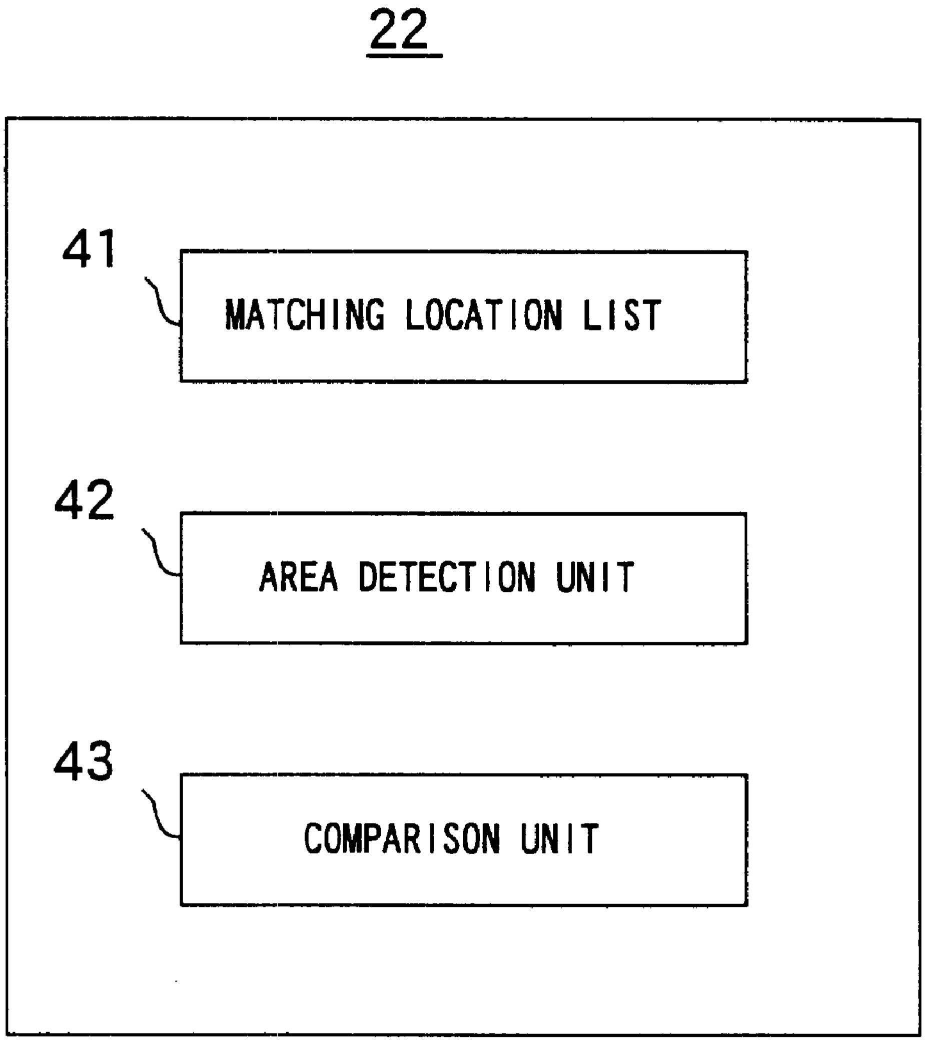
F I G. 1 0

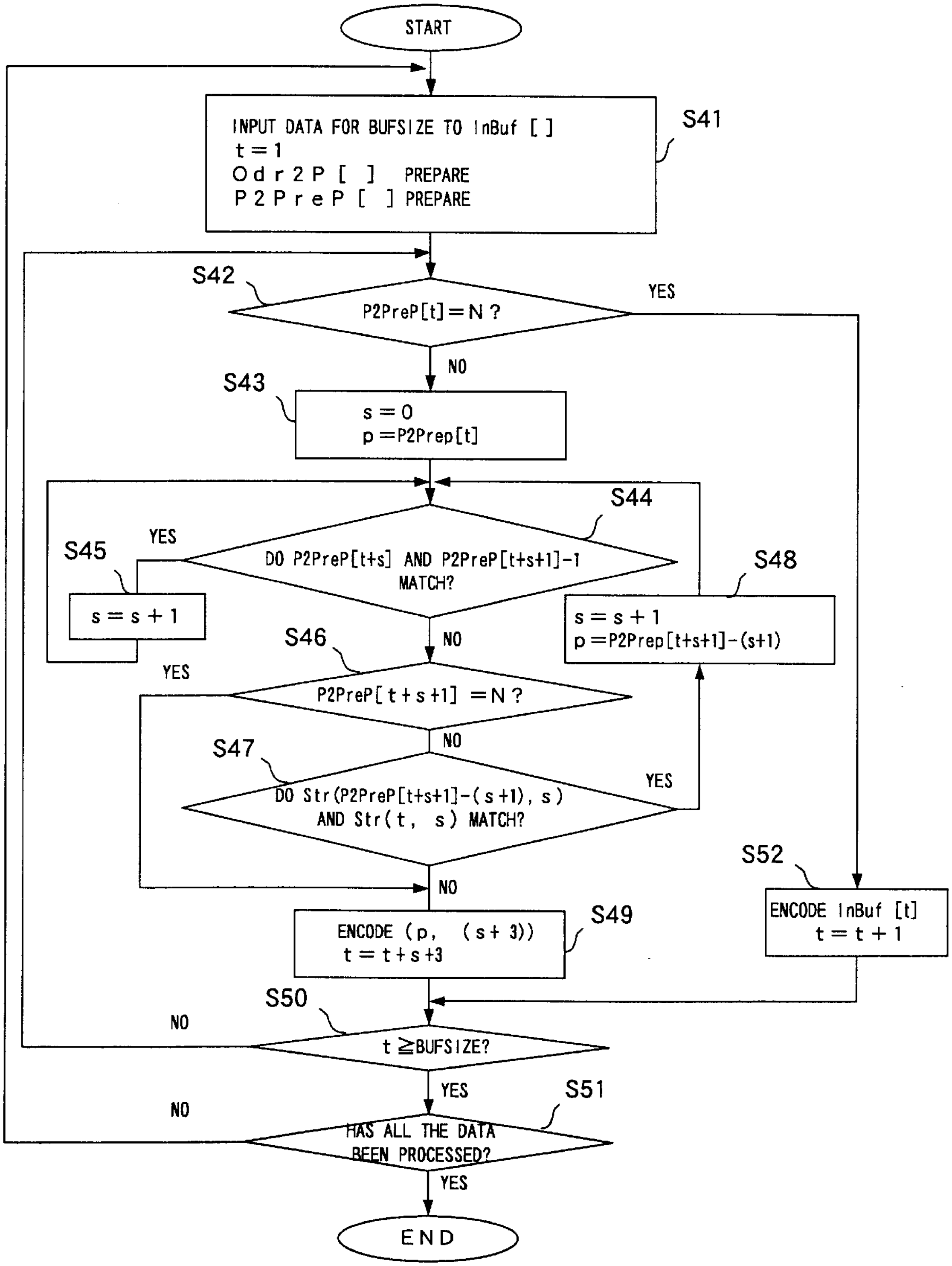
F I G. 1 3

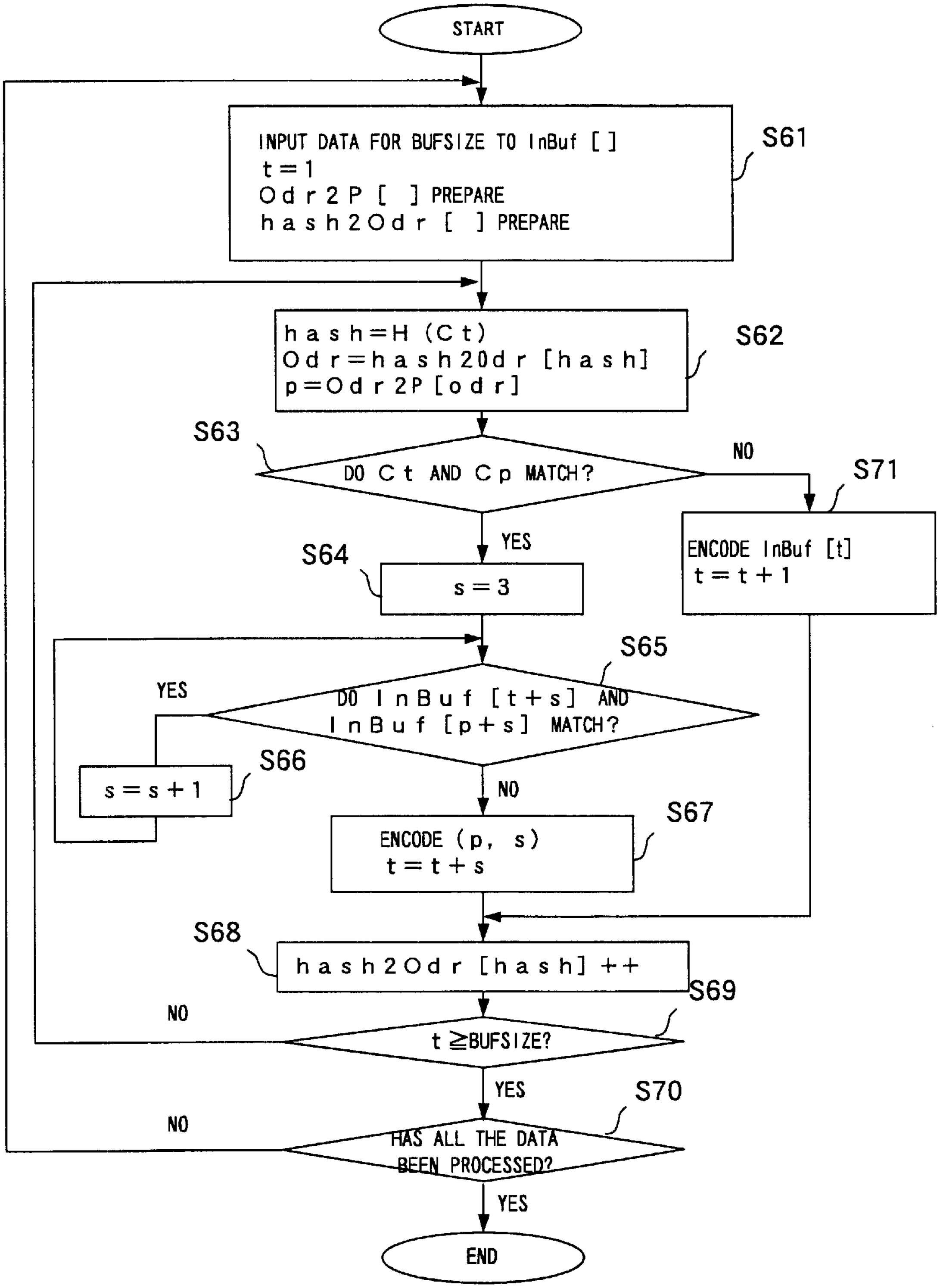
F I G. 1 6

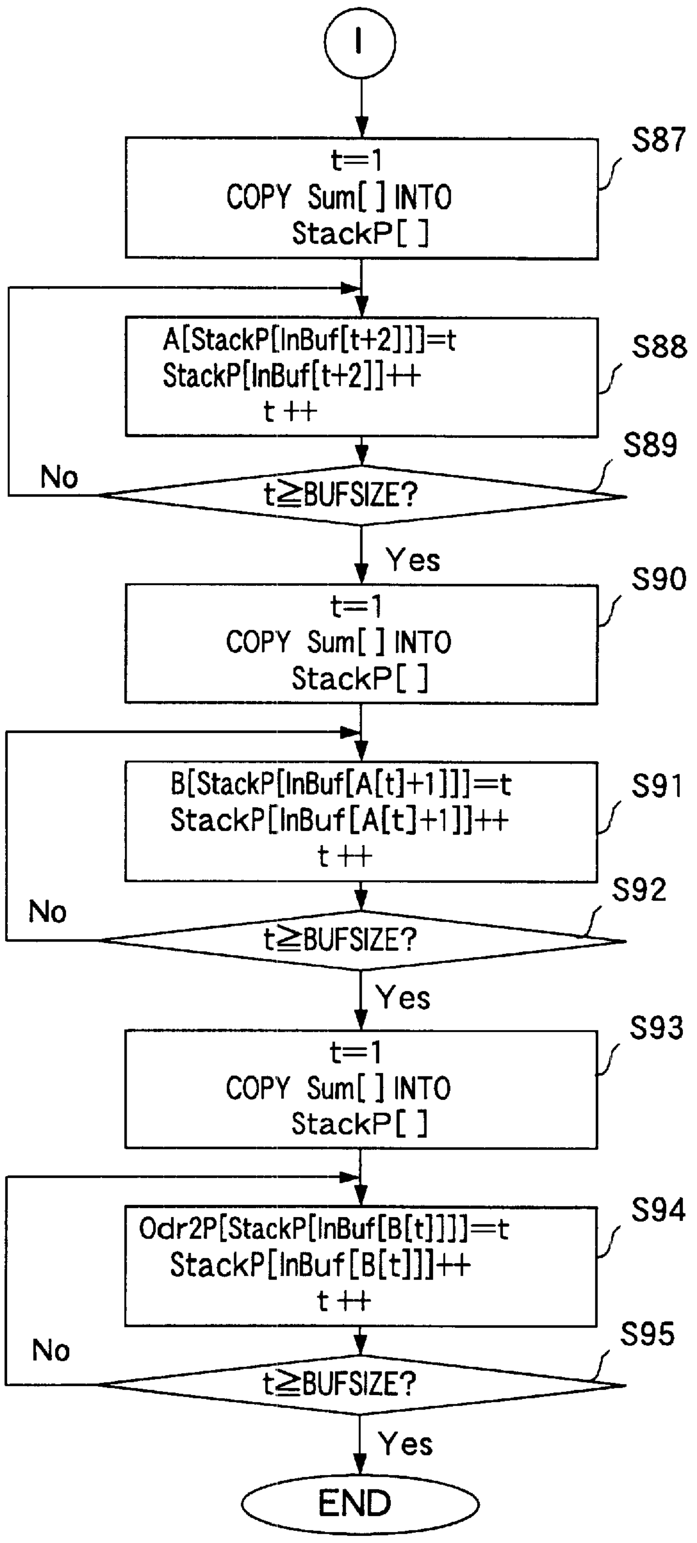
F I G. 1 8

APPARATUS FOR REPEATEDLY COMPRESSING A DATA STRING AND A METHOD THEREOF

BACKGROUND OF THE INVENTION

1. Field of the Invention

The present invention relates to an apparatus for compressing data strings to be compressed and a method thereof using a dictionary made by the data strings. Data to be compressed is handled by a unit. The unit may be bits, characters, words, pixels, gray levels, or some other appropriate unit. The present invention can be applied to the compression of various types of data and is not limited to the compression of a character code. In the following, however, we call the unit as a character based on information theory.

2. Description of the Related Art

The data amount being handled has been increasing as various types of data such as a character code, image data, etc., is being handled by computer in recent years. When such a great amount of data is handled, the required storage capacity can be decreased or the data can be transmitted to a remote place at high speed by omitting a redundant part of the data and compressing the remaining data.

As a conventional data compression technology, two technologies are known such as a dictionary model encoding technology using the repetition of a data string and a probability statistical model encoding technology using the appearance frequency of a data string. As the representative method of the dictionary model, LZ77 encoding and LZ78 encoding technologies are well known ("Document data compression algorithm introduction", by Tomohiko Uematsu, CQ publication, pp. 131–208, 1995). Since the LZ77 encoding technology can obtain a sufficient compression ratio with an easy process compared with the LZ78 encoding technology, the LZ77 encoding technology has become a mainstream when these technologies are actually used.

As shown in FIG. 1A, a slide buffer 1 with a regular size is provided in the LZ77 encoding technology. The buffer 1 retrieves a character string that matches an input character string in the longest length in the buffer 1, and encodes the input character string using the location and length. This encoding method is called as slide dictionary law, since the buffer 1 is sliding, as the encoding process proceeds.

When an input character string "abcdaaaq . . . " right next to the buffer 1 is encoded in FIG. 1A, "abcd" is the longest matching character string among the character strings matched in the buffer 1. Thereupon, a relative address "5 (bytes)" of the nearest location of the longest matching character string and the input character string (the matching location A against the input location B=the fifth character to the left of the input location B) is set as a matching location. Then, a code such as (matching location, matching length)=(5,4) is generated while setting a length "4 (bytes)" of the longest matching character string as a matching length. In this way, "abcd" of the first part of the input character string is replaced with (5,4). Similarly, the next character string "aaa" is replaced with a code (13,3).

However, a slide buffer that is actually used is much longer, and when character strings inside the buffer are sequentially retrieved, a long time is required in order to detect the longest matching character string. In fact, all the character strings inside the buffer are not compared with the input character string, but the appearance locations of the prefixes (about 2 to 4 characters) of character strings are registered in a table. Then, the input string is compared with a character string positioned at the location of the table where the character string is stored. A Look-Up Table (LUT) and a Hash Table are used for such a retrieval process.

FIG. 1B shows a character string retrieval process using the LUT. LUT2 of FIG. 1B sets the prefix of a character string inside the buffer 1 as an address, and stores the location (address or pointer) of the character string in the buffer 1. At the time of the retrieval process, the area of the LUT2 is accessed by setting the prefix of an input character string as an address, and the location of the corresponding character string is obtained.

In the case that a plurality of character strings with the same prefixes exist in the buffer 1, a plurality of appearance locations are stored in the form of a linked list 3. Therefore, locations of all the corresponding character strings stored in the buffer 1 can be obtained only by accessing the LUT2 one time. Here, the prefix of two characters is used, and the area of the LUT2 corresponding to the prefix "ab" of the input character string stores two appearance locations, utilizing the linked list 3.

Thus, since the LUT corresponds to one character string to be retrieved, to one area of the table, and can obtain required information only by looking up a table one time, the LUT can perform a retrieval process at high speed. However, in the case of the retrieval process of a long character string, the number of the areas required for the table increases with n-th power of character strings which appear. Accordingly, the area required becomes large. If the number of characters which appear is $2^8$=256, $256^n$ areas are required for the prefixes of n characters.

When the character string to be retrieved becomes long, however, an actually used (registered) area remains only part of the prepared areas, and the inside of the table becomes thinned. Therefore, in the case of the retrieval process of a long character, the memory efficiency deteriorates.

Thereupon, a character string to be retrieved is degenerated in the hash table, so that a plurality of character strings are made to share one area. Therefore, after the table is looked up, it should be checked whether the thus-obtained character string is actually retrieved. In comparison with the LUT, the hash table can retrieve a longer character string using the same table area as that of the LUT.

FIG. 1C shows a character string retrieval process using the hash table. A hash code generation unit 4 of FIG. 1C generates a hash code 5 from a prefix "abc" of the input character string, and it accesses a hash table 6 while setting the code as an address. In the hash table 6, the location inside the buffer 1 corresponding to the hash code 5 is stored in the hash table 6. By comparing a character string "abcde" at the location with the input character string, it is checked whether the prefixes of the two strings match each other. When the two strings match each other, it is judged that a character string in accord with the input character string exists in the buffer 1.

In the case of the hash table, too, a plurality of appearance locations are stored in the form of a linked list for a plurality of character strings with the same prefix in the buffer 1. In either case, the liked list is used to retrieve a longest matching character string.

However, there is the following problem in the above-mentioned conventional data compression technology.

In the case that a long matching character string is retrieved by using the LUT, the inside of the table becomes thinned as mentioned above, since only part of the table is used even if a table with a large area is prepared. In a hash table, the table size becomes smaller relative to that of the LUT. However, the inside of the table becomes thinned, if there is little input data. Therefore, as for the hash table, there is the problem that a memory is not used effectively.

Further, there is another problem that since a plurality of appearance locations stored in a linked list should be traced one by one in the case of a retrieval process of the longest matching character string, a longer retrieval time is required as the number of character strings with the same prefix increases.

SUMMARY OF THE INVENTION

The object of the present invention is to offer a data compression apparatus and a string retrieval apparatus with a reasonable memory capacity corresponding to an input data amount, thereby effectively performing the longest match retrieval process in a data compression process based on the dictionary model encoding technology.

A compression apparatus of the present invention is provided with a data storage device, sort device, appearance location storage device, detection device, and encoding device.

The data storage device stores character string data to be compressed. The sort device rearranges each sorted character string of which a start point is each of addresses stored in the data storage device, on the basis of the contents of each character string. The appearance location storage device stores address information that shows the address of each character string in the order of the rearranged character strings. The detection device detects a repetitive character string on the basis of the address information stored in the appearance location storage device. The encoding device encodes the detected repetitive character string and outputs the encoded character string.

BRIEF DESCRIPTION OF THE DRAWINGS

FIG. 1A is a diagram showing a conventional compression method;

FIG. 1B is a diagram showing a retrieval process using an LUT;

FIG. 1C is a diagram showing a retrieval process using a hash table;

FIG. 2A is a diagram showing the principle of a data compression apparatus of the present invention;

FIG. 2B is a diagram showing an input buffer;

FIG. 3 is a table showing the first rank list;

FIG. 4 is a table showing the second rank list;

FIG. 5 is a diagram showing the configuration of a data compression apparatus;

FIG. 8 is a flowchart of the first compression process;

FIG. 9 is a flowchart of the second compression process;

FIG. 10 is a diagram showing the second match detection unit;

FIG. 13 is a flowchart of the fourth compression process;

FIG. 16 is a flowchart of the fifth compression process;

FIG. 18 is a flowchart (No.2) of the rank list generation process;

DESCRIPTION OF THE PREFERRED EMBODIMENTS

Figure 6:
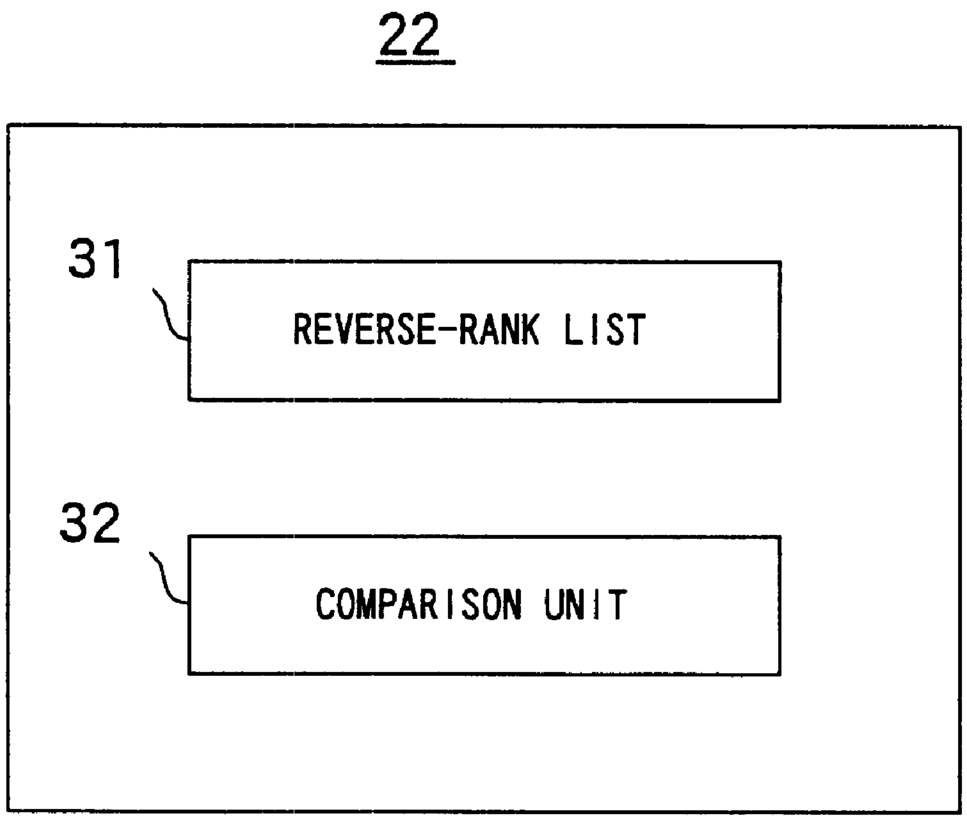
FIG. 6 is a diagram showing a configuration of the first match detection unit.

The embodiments of the present invention will be explained in detail by referring to the drawings.

FIG. 2A is a diagram showing a data compression apparatus of the present invention. The data compression apparatus of FIG. 2A includes a data storage device 11, sort device 12, appearance location storage device 13, and detection device 14.

Next, the detection device 14 refers to the relationship between each piece of address information stored in the appearance location storage device 13 and the rank (storage position) of each piece of address information in the appearance location storage device 13, and detects a character string that repeatedly appears in the data storage device 11. Then, an encoding device 15 encodes the repetition that appears the second and subsequent times, and outputs the encoded code.

According to such a data compression apparatus, a plurality of character strings that appear in the data storage device 11 are rearranged regularly to be stored in the appearance location device 13. Therefore, if the appearance location storage device 13 is referred to, a plurality of locations where the same character strings appear can be easily detected, so that the character string retrieval process is economized. At this time, the longest match retrieval process can be further economized by rearranging the character strings in such a way that a plurality of the same character strings adjoin each other.

Since the number of pieces of address information stored in the appearance location storage device 13 is approximately the same as the number of addresses of the data storage device 11 for storing the compression data, the character string retrieval process can be performed using a memory capacity that is almost proportional to the input data amount.

For example, the data storage device 11, sort device 12, appearance location storage device 13 and detection device 14 of FIG. 2A correspond to an input buffer 21, sort unit 25, appearance location holding unit 26, and match detection unit 22 of FIG. 5, respectively, which will be described later. The encoding device 15 of FIG. 2A corresponds to a code generation unit 23 and code output unit of FIG. 5.

In the present embodiments, an input buffer for holding an input character string is provided. Each character string of which a start point is each address in the buffer is rearranged based on the contents of the character string, and a rank list is generated. Using the rank list that is a dictionary, character string retrieval is performed, so that the matching location and the matching length are obtained.

In the case that an input buffer as shown in FIG. 2 is provided, the respective prefixes of three characters are extracted from the respective character strings of which start points are the respective addresses in the buffer. Then a rank list as shown FIG. 3 is prepared. The rank list of FIG. 3 corresponds to a table with elements (records) of which the number is the same as that of elements of the input buffer shown in FIG. 2. In each record, the address of a location where each prefix appears in the input buffer of FIG. 2, is stored.

An input character string of 34 bytes such as "compression_decompress_compression" is held in the input buffer. The prefixes such as "com", "omp" and also "mpr" are extracted from addresses 1, 2 and 3, respectively. Similarly, prefixes of 3 characters are extracted from other addresses. Note that a symbol "_" indicates a space. The addresses of "1" to "32" that correspond to the appearance positions of these prefixes are stored in the rank list.

Next, the addresses held in the rank list are rearranged in the order of the codes of the respective characters of the corresponding prefixes, thereby preparing a rank list as shown in FIG. 4. The rank list of FIG. 4 holds the same number of records as that of the rank list of FIG. 3.

A plurality of the same prefixes, such as "com" and "ssi" that are included in the input buffer, are arranged adjoining one another in the appearance order. Therefore, the address of a character string which appears recently among character strings with the same prefix as that of a certain character string, is stored without fail in a record immediately before (one rank higher) the record where the address of the certain character string is stored. Therefore, the matching character can be retrieved more easily by comparing a character string to be encoded in the input buffer with the character string of an address that is held in the immediately preceding record.

Since addresses of the other matching candidates are also continuously stored, in the case of the longest match retrieval process, a character string to be encoded may be compared with a plurality of character strings corresponding to the plurality of addresses that are continuously stored. Consequently, the longest matching process is sped up. Furthermore, since the input buffer and the rank list are of the same length, the information required for the retrieval can be stored using memory capacity approximately proportional to the length of the input buffer.

Next, a compression process using the rank list shown in FIG. 4 is explained in detail by referring to FIGS. 5 to 18.

FIG. 5 is a drawing showing the configuration of a data compression apparatus of the present embodiment. The data compression apparatus of FIG. 5 is of, for example, a computer, and it includes the input buffer 21, match detection unit 22, code generation unit 23, code output unit 24, sort unit 25, and appearance location holding unit 26.

The input buffer 21 holds the input character string as a compression data string. The sort unit 25 rearranges character strings of which start points are the respective addresses in the input buffer 21, based on the contents of the character strings, thereby preparing a rank list 27 that holds the addresses of the character strings using the rearranged order. An appearance location holding unit 26 holds the rank list as appearance location information.

The match detection unit 22 detects a repetitive character string in the input buffer 21 on the basis of the information listed in the rank list 27, and it passes the detected string, along with the other character strings, to the code generation unit 23. The code generation unit 23 generates codes of the character strings received from the match detection unit 22. The code output unit 24 outputs the generated codes as compression data. The following three methods are conceivable for the retrieval process of the repetitive character string using the rank list 27:

(1) a method using a reverse-rank table (reverse-rank list), (2) a method using a matching position table (matching location list), and (3) a method using a retrieval table (hash table).

FIGS. 6 to 9 show a data compression process using the reverse-rank list.

In this case, the match detection unit 22 is provided with a reverse-rank list 31 and comparison unit 32. The reverse-rank list 31 stores information required for the rank of a character string listed in the rank list 27, from the address of a character string to be encoded in the input buffer 21. Then, the match detection unit 22 adopts the character string that starts at a higher address than the rank obtained from the reverse-rank list 31, as a matching candidate.

The comparison unit 32 compares a character string to be encoded with the character string of a matching candidate, and obtains a length of the matching character string. Then, the code generation unit 23 sets the obtained length as the matching length, sets an address of the matching character string as a matching location, and encodes the character string. In the case of the longest match retrieval process, a character string with the longest matching length is encoded among a plurality of matching candidates.

Figure 7:
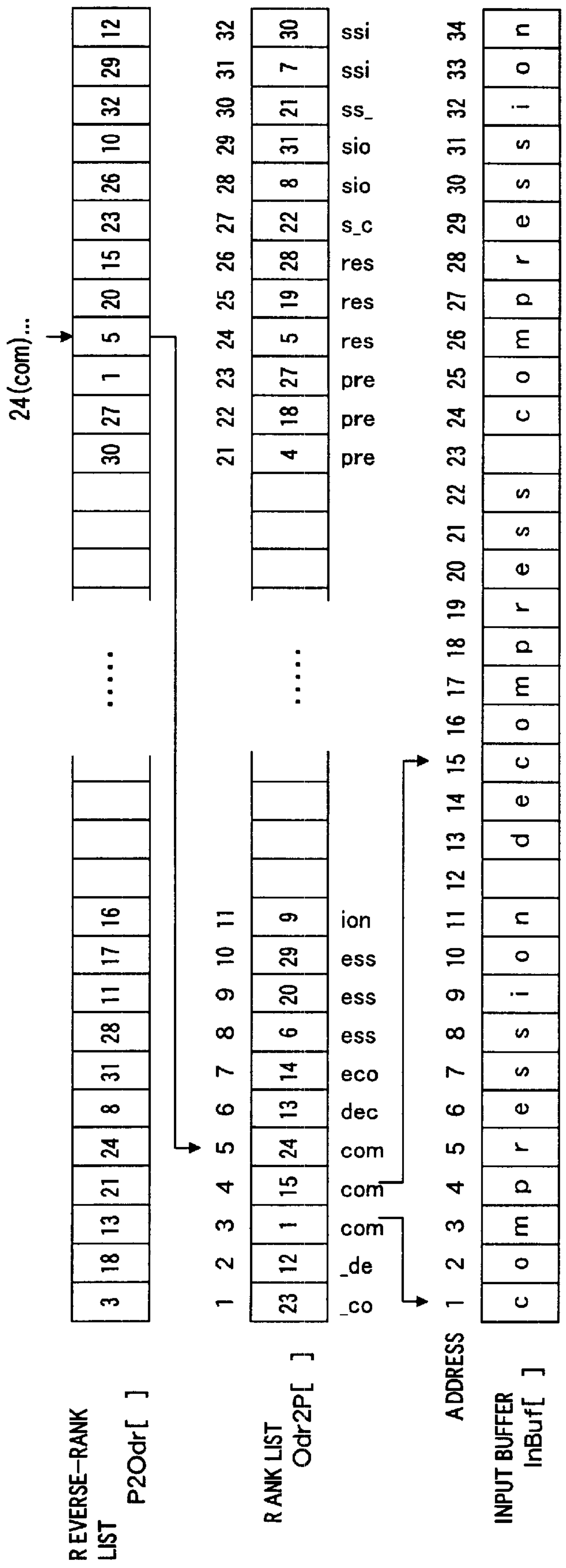
FIG. 7 is a reverse-rank list and a rank list.

For example, the reverse rank list and rank list shown in FIG. 7 are prepared by the input character string of FIG. 2. A rank list Odr2P[ ] of FIG. 7 is the same as the rank list of FIG. 4. The reverse-rank list P2Odr[ ] can be easily prepared by respectively storing the numbers indicating the ranks of the respective addresses which are held in the rank list Odr2P[ ], in the records corresponding to the respective addresses. For the first address "23" of the rank list Odr2p[ ], a rank number "1" is stored in the record of an address "23" of the reverse-rank list P2Odr[ ].

When a repetitive character string is detected, the match detection unit 22 accesses the reverse-rank list P2Odr[ ] and the rank list Odr2P[ ] on the basis of the address of the character string to be encoded, and it obtains the character string of the matching candidate.

If a character string "compression", of which a start point is an address "24" of an input buffer InBuf[ ], is to be encoded, a rank number "5" that is held in an address "24" of the reverse-rank list P2Odr[ ] is obtained, thereby accessing the obtained rank of the rank list Odr2P [ ]. Next, addresses "1" and "15" that are held in the higher rank "3" and "4", are obtained. Finally, character strings "compression_decom . . . " and "decompress_com . . . " of which the start points are these addresses, are set as matching candidates.

In the case that the longest match retrieval process is not performed, only the character string "decompress_com . . . " with a one rank higher becomes a matching candidate. In the case that the long match retrieval process is performed, both character strings become matching candidates.

The rank list can be easily accessed by providing the reverse-rank list, so that the character string retrieval process is effectively performed. Further, since the reverse-rank list is the same as the rank list in length, required information can be stored using a memory capacity that is approximately proportional to a length of the input buffer, even if both lists are combined.

FIG. 8 is a flowchart of a data compression process using the match detection unit of FIG. 6. In this process, the longest match retrieval process is not performed, and only the matching candidate that appears recently is retrieved.

The data compression apparatus inputs data for a predetermined size BUFSIZE to the input buffer InBuf[ ], and sets a variable t indicating an encoding location to 1 (step S1). Further, character strings of 3 characters of which start points are the respective addresses in the input buffer InBuf[ ] are rearranged in alphabet order, and a rank list Odr2P[ ] is prepared, so that a reverse-rank list P2Odr[ ] for Odr2P[ ] is prepared.

Next, the data compression apparatus checks whether a character string of which a start point is an address t appears before t. Here, the apparatus sets a variable odr indicating the rank of a matching candidate that appears recently, as P2Odr [t]−1, and it sets a variable p indicating an address of the matching location as Odr2P[odr] (step S2) In Odr2P[ ], the odr corresponds to the rank one higher than the rank of a character string of which a start point is an encoding location.

Then, a character string Ct=(InBuf [t], InBuf [t+1], InBuf [t+2]) of three characters of which a start point is an address t is compared with a character string Cp of three characters of which a start point is an address p (step S3)

If Ct and Cp match each other, a character string that starts at Cp is set as a matching candidate, and the matching length is obtained. First, a variable s indicating the longest matching length is set to 3 (step 4), thereby comparing InBuf t+s with InBuf p+s (step S5). If these match each other, s=s+1 is set (step S6), and processes in and after step S5 are repeated.

If InBuf [t+s] and InBuf [p+s] do not match in step S5, (p, s) is output as a code, and t=t+s is set (step S7), thereby comparing t with BUFSIZE (step S8). If t<BUFSIZE, processes in and after step S2 are repeated.

If t≧BUFSIZE in step S 8, it is checked whether the compression data has been processed (step S9). If decompression data remains, processes in and after step S1 are repeated. If data to be compressed has been already processed, the process terminates.

Since a matching candidate does not exist if Ct and Cp do not match in step S3, a start character InBuf [t] of Ct is output unchanged as a code. Then, t=t+1 is set (step S10), and processes in and after step S8 are repeated.

For example, in the case of the data of FIG. 7 to be compressed, compression data like "compression_de (1,8)_(15,8) (9,3)" is generated by the process of FIG. 8.

FIG. 9 is a flowchart of a data compression process of the case that the longest match retrieval process is performed. The processes in steps S11, S13 to S16 and S22 to S24 of FIG. 9 are the same as those in steps S1, S3 to S6 and S8 to S10 of FIG. 8, respectively.

In step S11, the data compression apparatus generates Odr2P [ ] and P2Odr [ ], and sets odr=P2Odr [t]−1 and p=Odr2P [odr] (step S12). At this time, a variable pre indicating a matching location of the longest matching character string is set as p, and a variable len indicating the longest matching length is set to 0. The matching length s of a matching candidate that appears recently is obtained by the processes in steps S3 to S6.

Next, s and len are compared with each other (step S17). If s>len, len=s and pre=p are set (step S18). In order to obtain a longer matching candidate, odr=odr−1 and p=Odr2P [odr] are set (step S19), and Ct and Cp are compared (step S20). If s≦len in step S17, processes in and after step S19 are performed without updating len and pre.

If Ct and Cp match each other, it is determined that a new matching candidate is detected, so that processes in and after step S14 are repeated. If a matching length of the candidate is longer than len, len and pr are updated.

In step S20, when Ct and Cp do not match each other, pre and len are output as codes, t=t+len is set (step, S21), and processes in and after step S22 are performed. Finally, the location and length of the longest matching character string are output as a code.

For example, in the case of the data of FIG. 7 to be compressed, compression data like "compression_de (1,8)_(1,11)" is formed by the process of FIG. 9.

Next, each of FIGS. 10 to 13 shows a data compression process using a matching location list. In this process, the input data is compressed after it is converted to a matching location list one time.

In this case, as shown in FIG. 10, the match detection unit 22 includes a matching location list 41, area detection unit 42, and comparison unit 43. The matching location list 41 is formed by the rank list 27, and stores information for obtaining a location (matching location) of the same character strings that appear recently, from the addresses of the respective character strings stored in the input buffer 21.

Figure 11:
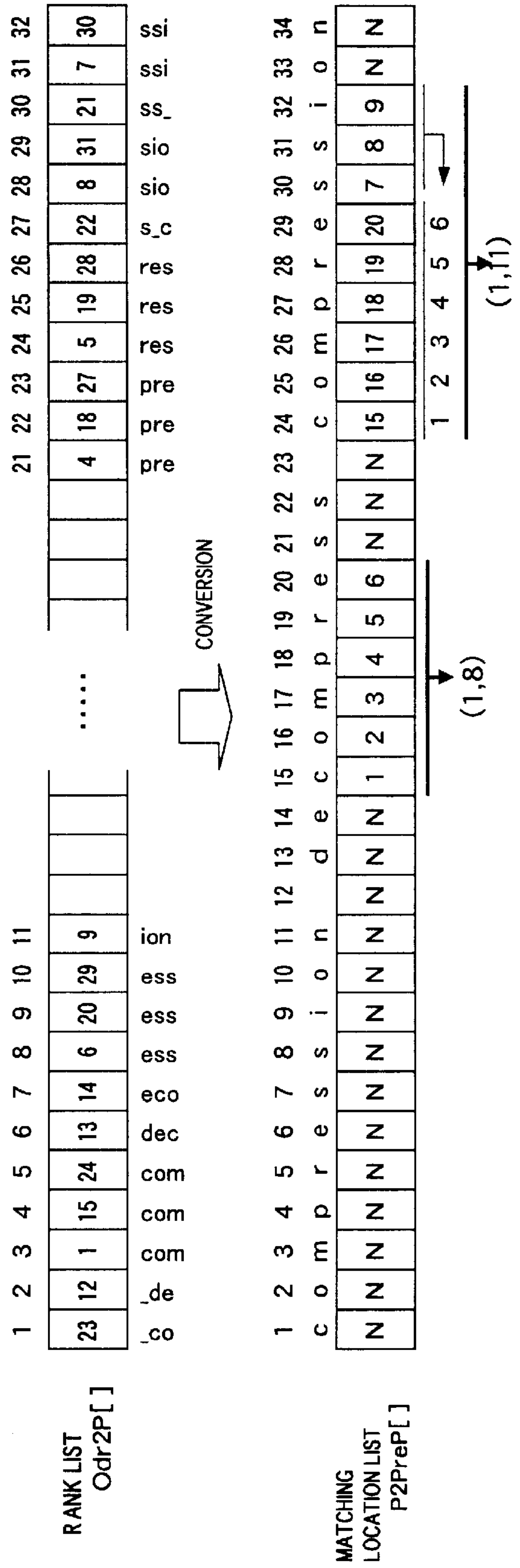
FIG. 11 is a rank list and a matching location list.

For example, a rank list Odr2P[ ] of FIG. 7 is converted to a matching location list P2PreP[ ] as shown in FIG. 11. The matching location list P2PreP[ ] consists of records of which the number is the same as that of the elements of the input buffer. In the record of each address, an address that is held in the rank one higher than the rank of a prefix of which a start point is the address, is stored in the rank list Odr2P [ ] as a matching location. However, a symbol "N" indicating that a matching candidate does not exist is stored in the case that the prefix registered one rank higher is different.

When the matching location list P2PreP[ ] is prepared, the match detection unit 22 checks the addresses held in the rank list Odr2P[ ] in order from the upper ranks. If the prefix registered in a rank to be focused on is the same as the prefix registered in a rank one higher than the rank, the address held in the rank of the latter is stored in a record corresponding to the address held in the rank of the former.

If the prefix registered in a rank to be paid attention to is different from the prefix registered in a rank one higher, a symbol "N" is stored in a record corresponding to the address held in the rank of the former. By repeating such a process, the matching location list P2PreP [ ] can be easily prepared.

For example, regarding the first address "23" in the rank list Odr2P [ ], there is no record in a rank one higher. Thereupon, a symbol "N" is stored in the address "23" of the matching location list P2PreP [ ]. Regarding the fifth address "24" in the rank list Odr2P [ ], a record of the fourth address "15" corresponds to the same prefix "com". Thereupon, the address "15" held in the fourth record is stored in the address "24" of the matching location list P2PreP [ ].

The area detection unit 42 of FIG. 10 compares the values (addresses) of the records of the matching location list 41, which adjoin each other, and detects an area where the value indicating a matching location continuously increases one at a time. Then, the code generation unit 23 sets a start value of the area as a matching location, and obtains the matching length from the lengths, each of which has a continuation value, thereby encoding a character string.

In the matching location list P2PreP [ ] of FIG. 11, for example, values of the records continuously increase one at a time from "1" to "6" in the area of addresses of "15" to "20". Thereupon, the length of a prefix "3" registered in the rank list is added to the length of an area "6", and the thus-added value is subtracted by "1", thereby setting the obtained result "8(=6+3−1)" as a matching length. Then, a code such as (1,8) is formed while setting a value "1" of the first record as a matching location.

In the case of the longest match retrieval process, the area detection unit 42 detects a part where two or more areas, each having a continuation value, are connected, in the matching location list 41. After that, the match detection unit 22 analyzes the addresses held in a plurality of detected continuation areas, and obtains locations of a plurality of matching candidates.

Next, the comparison unit 32 compares a character string to be encoded with a character string of each matching candidate, and obtains a length of the matching character string. Then, the code generation unit 23 encodes the character string using the matching location and matching length of the longest matching character string among a plurality of matching candidates.

For example, in the matching location list P2PreP [ ] of FIG. 11, values of the records continuously increase from "15" to "20" in the area of addresses "24" to "29". Further, the values of the records continuously increase from "7" to "9" in the area of addresses "30" to "32". Since these two continuation areas are connected, the longest match retrieval process is performed by encoding a character string "compression" of which a start point is an address "24".

It is understood that in this case, there is a candidate for an address "1" which is longer than a matching candidate of the address "15", in the address "24" of the first continuation area, on the basis of the value of the second continuation area from the addresses "30" to "32". The matching length "11(=9+3−1)" can be obtained by adding a length "3" of the prefix to a length "9" of the two continuation areas, thereby subtracting "1" from the thus-added value. Thus, a code such as (1,11) is prepared.

Even in the case that three or more continuation areas are connected, a code indicating a matching location and matching length of the longest matching character string is similarly prepared. In the case that an n number of continuation areas are connected, it is generally assumed that there are at least an n number of matching candidates, and the longest matching character string is included in the candidates.

Thus, a matching location and matching length can be easily obtained by converting the rank list to the matching location list, so that the character string retrieval process is economized. Further, since the matching location list is the same as the input buffer in length, required information can be stored using a memory capacity proportional to the length of an input buffer. In FIG. 11, an address of the matching location is stored in the matching location list, but a relative address from each address to the matching location can be stored instead of the above-mentioned address.

Figure 12:
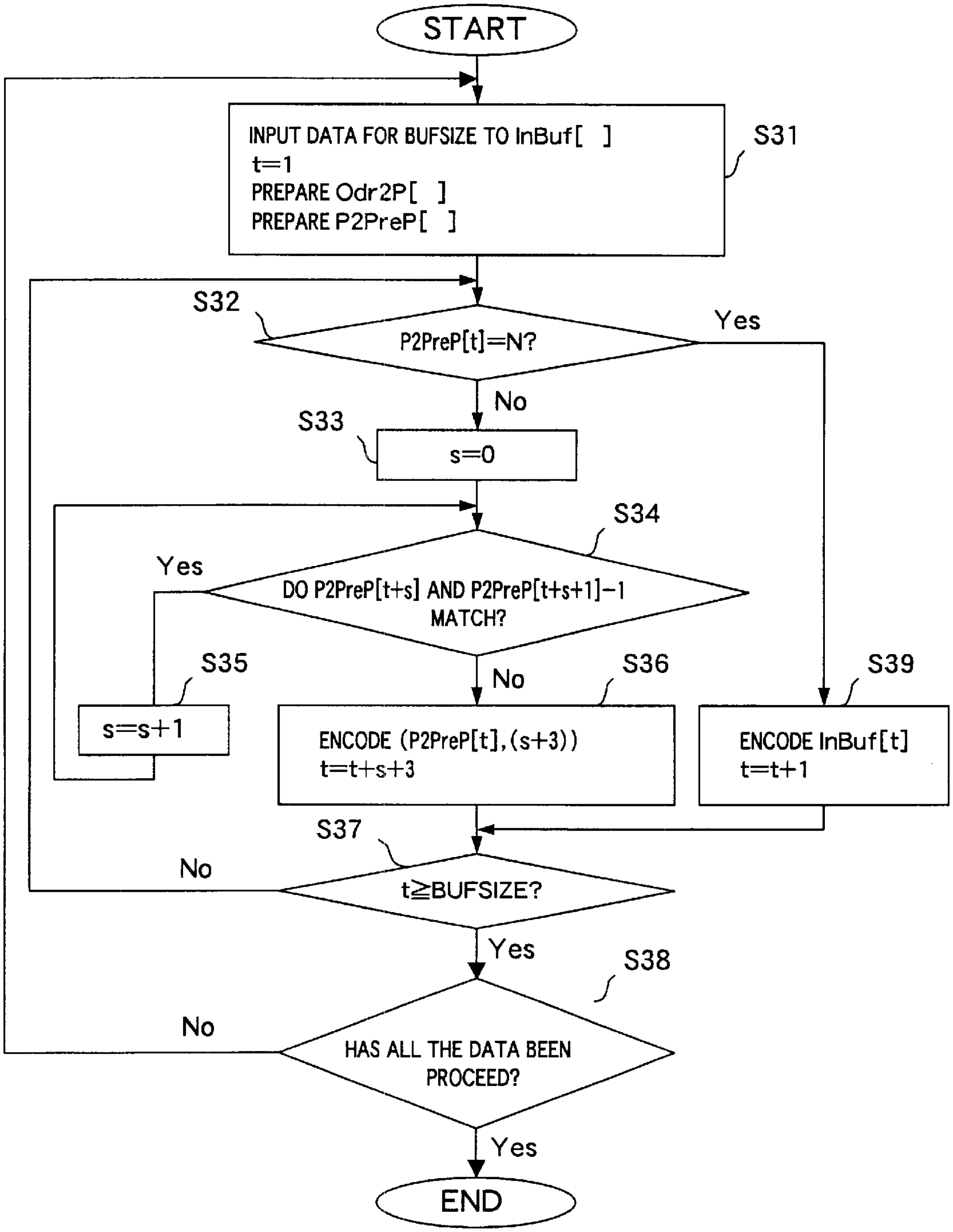
FIG. 12 is a flowchart of the third compression process.

FIG. 12 is a flowchart of the data compression process using a match detection unit of FIG. 10. In this process, the longest match retrieval process is not performed, and only a matching candidate that appears recently is retrieved.

The data compression apparatus inputs data for BUFSIZE to the input buffer InBuf [ ], and sets a variable t to 1 (step S31). Further, the apparatus prepares a rank list Odr2P [ ] from the data of InBuf [ ], and also prepares a matching location list P2PreP [ ] from the Odr2P [ ].

Next, the data compression apparatus compares P2PreP [t] with "N", and checks whether there is a matching candidate for a character string of which a start point is an address t (step S32). If the value is not "N", it is understood that a matching candidate exists. Therefore, the data compression apparatus sets a variable s indicating "the length of a continuation area −1" to 0, and compares P2PreP [t+s] with P2PreP [t+s+1]−1.

If P2PreP [t+s] and P2PreP [t+s+1]−1 match each other, P2PreP [t+s+1] indicates not only "N" but also a value bigger than P2PreP [t+s] by one. Thereupon, s=s+1 is set (step S35), and the process in step S34 is repeated.

If P2PreP [t+s] and P2PreP [t+s+1]−1 do not match in step S34, P2PreP [t] is set as a matching location, and a code (P2PreP [t], (s+3)) is output while setting s+3 as a matching length (step S36). Then t=t+s+3 is set, and t and BUFSIZE are compared (step S37). If t<BUFSIZE, processes in and after step S32 are repeated.

If t≧BUFSIZE in step S37, it is checked whether data to be compressed has been processed (step S38).If data remains, processes in and after step S31 are repeated. If all the data has been processed, the process terminates.

If P2PreP [t] is "N" in step S32, it is understood that a matching candidate does not exist. Therefore, the data compression apparatus outputs InBuf [t] unchanged as a code, sets t=t+1 (step S39), and performs processes in and after step S37.

In the case of the data of FIG. 7 to be compressed, for example, compression data like "compression_de (1,8)_ (15,8) (9,3)" is generated by the process of FIG. 12.

FIG. 13 is a flowchart of the data compression process when the longest match retrieval process is performed. The processes in steps S41 and S42, S44 and S45, and S50 to S52 of FIG. 13 are the same as those in steps S31 and S32, S34 and S35, and S37 to S39 of FIG. 12.

If P2PreP [t] is not "N" in step S44, the data compression apparatus sets s=0, and also sets a variable p indicating a matching location of the longest matching character string as P2PreP [t] (step S43). Then, the apparatus updates the value s by performing processes in steps S44 and 45.

If P2PreP [t+s] and P2PreP [t+s+1]−1 do not match in step S44, the data compression apparatus compares P2PreP [t+s+1] with "N", and checks whether the next continuation area connected with the first continuation area exists (step S46).

For example, in the case of FIG. 11, P2PreP[24+5] becomes 20, and P2PreP [24+5+]1−1 becomes 7−1=6 at the time of t=24 and s=5. Since both do not match each other, P2PreP[30]=7 is compared with "N".

If P2PreP [t+s+1] is not "N", it is understood that the next continuation area exists. Thereupon, an address, P2PreP [t+s+1]−(s+1) obtained by the first value of the area such as P2PreP[t+s+1]−(s+1) is set as a location of a new matching candidate, and the character string is compared with a character string to be encoded.

First, a character string with a length of s+1, of which a start point is an address t, is set as Str (t, s)=(InBuf [t], InBuf [t+1], . . . , or InBuf [t+s]. Then, Str (P2PreP [t+s+1]−(s+1), s) is compared with Str (t, s) (step S47).

If these character strings match each other, s is set as s+1, and p is set as P2PreP [t+s+1]−(s+1) while regarding a new matching candidate as the longest matching character string (step S48). Then, processes in and after step S44 are repeated.

When two character strings do not match in step S47, (p, (s+3)) is output as a code, and t=t+s+3 is set (step S49). Then, processes in and after step S50 are performed.

If P2PreP [t+s+1] is "N" in step S46, processes in and after step S49 are performed since the next continuation area does not exist. Thus, the location and the length of a character string with the longest matching length is finally output as a code.

In the case of FIG. 11, Str (P2PreP [24+5+1]−(5+1), 5)=Str (1,5) is compared with Str (24,5) in step S47. Since these character strings indicate "compre", s=6 and p=1 are set, and processes in and after step S44 are repeated.

At the time of s=8, P2PreP [24+8+1] becomes N in step S46, so that a code such as (1, (8+3))=(1,11) is generated.

Therefore, compression data like "compression_de (1,8)_ (1,11)" are finally generated.

Figure 14:
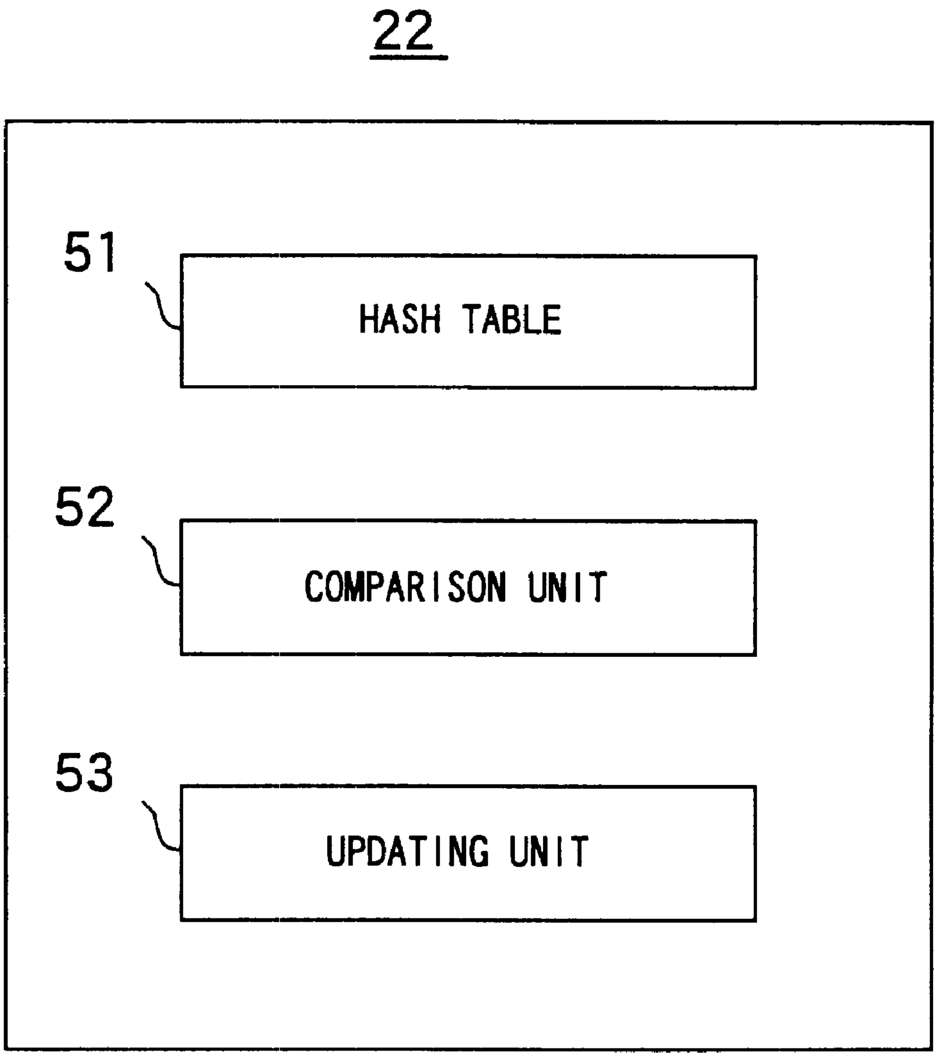
FIG. 14 is a diagram showing a configuration of the third match detection unit.
Figure 15:
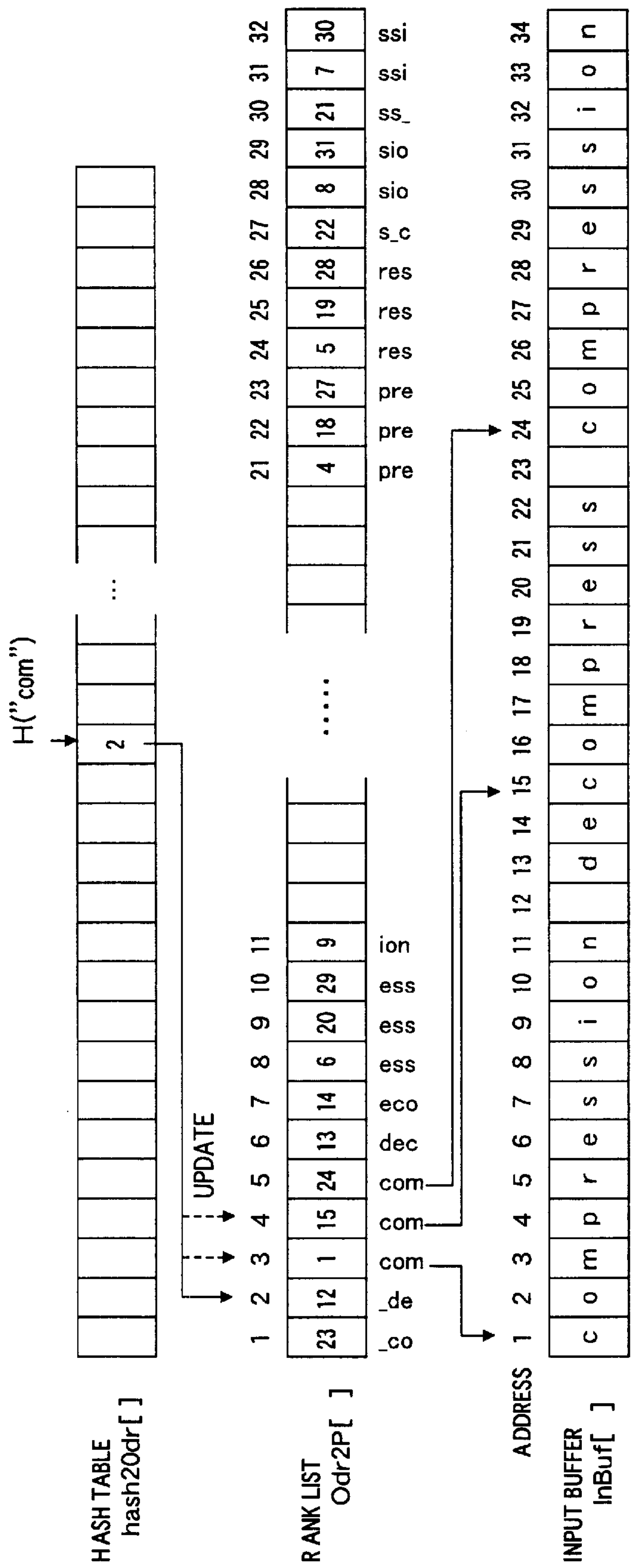
FIG. 15 is a hash table and a rank list.

Next, each of FIGS. 14 to 16 shows the data compression process using a hash table. In this process, a rank list is accessed, instead of the reverse rank list of FIG. 7, using a hash table.

In this case, as shown in FIG. 14, the match detection unit 22 includes a hash table 51, comparison unit 52, and updating unit 53. The hash table 51 stores information to obtain the rank of a character string with the same prefix in the rank list 27, from the prefixes of the character strings to be encoded in the input buffer 21. Then, the match detection unit 22 adopts a character string that starts at the rank obtained by the hash table 51, or at an address in a higher rank than the rank as a matching candidate.

The comparison unit 52 compares a character string to be encoded with a character string of the matching candidate, and obtains a length of the matching character string. The code generation unit 23 sets the obtained length as a matching length, and also sets an address of the matching character string as a matching location, and encodes the character string. In the case of the longest match retrieval process, a candidate with the longest matching length is encoded from among a plurality of matching candidates. Further, the updating unit 53 changes the rank obtained from the hash table 51 to the rank of a character string which appears recently with the same prefix.

FIG. 15 shows an example of the process of accessing the rank list using such a hash table. A rank list Odr2P [ ] of FIG. 15 is the same as that of FIG. 4. The hash table hash Odr2P [ ] stores a rank number of the rank list Odr2P [ ], while setting the hash value as an address. A hash value for accessing the table is generated using a hash function H, by the hash code generation unit 4 as shown in FIG. 1C. Further, the size of this table is generally $2^M$, and is designated by an integer M.

If a plurality of the same prefixes are registered in the rank list Odr2P [ ], a rank number one higher than that of a block of these prefixes is held in an initial state of the hash table hash2Odr [ ], corresponding to the hash value that is obtained from these same prefixes. For example, a prefix "com" of three characters is registered in the third, fourth, and fifth ranks of the rank list Odr2P [ ]. When a compression process starts, however, a rank number "2" is stored in the address corresponding to a hash value H of "com".

When a repetitive character string is detected, the match detection unit 22 accesses the hash table hash2Odr [ ] and the rank list Odr2P [ ] on the basis of a prefix of three characters of a character string to be encoded, thereby obtaining the character string of a matching candidate.

For example, if a character string "compression_decom . . . " of which a start point is an address "1" of the input buffer InBuf [ ] is to be encoded, the match detection unit 22 first generates a hash value H ("com") from the prefix "com" of 3 characters. Next, in the hash table hash2Odr [ ], the match detection unit 22 obtains a rank number "2" held in an address of the hash value, and accesses the rank of the rank list Odr2P [ ].

In this case, a matching candidate does not exist since the same prefix is not registered in the rank. Thereupon, the match detection unit 22 outputs the first character "c" unchanged, and adds 1 to a rank number "2" held in the address H ("com") of the hash table hash2Odr [ ]. In this way, the rank number "2" obtained from the prefix "com" is changed to a rank number "3" that is one rank lower.

When a character string "compression_decom . . . " of which a start point is an address "15" is to be encoded, the match detection unit 22 obtains the updated rank number "3" from the hash table hash2Odr [ ] on the basis of a hash value of the prefix "com", and accesses the rank in the rank list Odr2P [ ].

Next, the match detection unit 22 obtains an address "1" held in the rank "3", and sets a character string "compression_decom . . . ", of which a start point is the address, as a matching candidate. Then, the match detection unit 22 outputs a code of the matching location and matching length, and updates a value of the hash table hash2Odr [ ] again. Thus, the rank "3" obtained from the prefix "com" is changed to "4" which is one rank lower.

After that, the match detection unit 22 obtains the updated rank number "4" from the hash table hash2Odr [ ] when a character string "compression" of which a start point is an address "24", is to be encoded, and accesses the rank of the rank list Odr2P [ ].

Next, the match detection unit 22 obtains addresses "1" and "15" held in the ranks "3" and "4" one rank higher, respectively. Then, the match detection unit 22 sets character string "compression_decom . . . " and also "decompress_com . . . ", of which start points are these addresses, as matching candidates. In the case that the longest match retrieval process is not performed, only the character string "decompress_com . . . " of the rank "3" becomes a matching candidate. In the case of the longest match retrieval process, both character strings become matching candidates.

Thus, by providing a hash table like this, a rank list can be easily accessed, thereby economizing the character string retrieval process. Further, since the length of a hash table can be made shorter than that of the rank list, required information can be stored within the memory capacity proportional to the length of an input buffer, even if these lists are combined. Still further, the rank of a matching candidate that has appeared recently is held by shifting the rank indicated by the hash table to a lower rank, one rank at a time, each time an encoding process is performed. As a result, the longest match retrieval process is economized.

FIG. 16 is a flowchart of the data compression process using a match detection unit of FIG. 14. In this process, the longest match retrieval process is not performed, and only the matching candidate that has appeared recently is retrieved. Processes in steps S63 to S67 and also S69 to S71 of FIG. 16 are the same as those in steps S3 to S7 and also S8 to S10 of FIG. 8.

The data compression apparatus first inputs data for BUFSIZE to the input buffer InBuf [ ], and sets a variable t to 1 (step S61). Further, the data compression apparatus generates a rank list Odr2P [ ] from the data of InBuf [ ], and generates a hash table hash2Odr [ ] for Odr2P [ ] Next, a character string of 3 characters of which a start point is an address t is set as Ct=(InBuf [t], InBuf [t+1], InBuf [t+2]), and a variable hash indicating the hash value is set as H(Ct) (step S62). A variable odr indicating the rank of a matching candidate that has appeared recently is set as hash2Odr [hash], and a variable p indicating the matching location is set as Odr2P [odr].

Next, by performing processes in steps S63 to S67, the data compression apparatus checks whether a character string, of which a start point is an address t, appears before t. If such a character string appears, the apparatus outputs the matching location and matching length as a code. Then, the apparatus adds 1 to the hash2Odr [hash], shifts the rank corresponding to the hash to one lower rank (step S68), and performs processes in and after step S69. After the data compression apparatus outputs InBuf [t] as a code and sets t=t+1 in step S71, the apparatus performs processes in and after step S68.

The compression result obtained by the process of FIG. 16 is the same as that obtained by the process of FIG. 8. In the case of the longest match process, it is sufficient to add the modification of the process of FIG. 16 similar to that of the process of FIG. 9.

The above-mentioned rank list is generated by sorting prefixes of character strings of which start points are the respective addresses of the input buffer, in the order of codes of the respective characters, and by rearranging appearance locations of the respective character strings. At this time, an arbitral sort method such as a radix sort method, quick sort method, bubble sort method, etc., can be used.

In the radix sort method, for example, a sort method is performed by repeating the bin-sort operation in the order from the N-th character while paying attention to the k-th character included in the prefix of N characters (N bytes). In the quick sort method, a sort process is performed by dividing the set of prefixes of N characters into two while setting one prefix as a criterion. In the bubble sort method, a sort process is performed by comparing two prefixes adjoining each other, and repeating an operation of exchanging these prefixes on the basis of the result.

Figure 17:
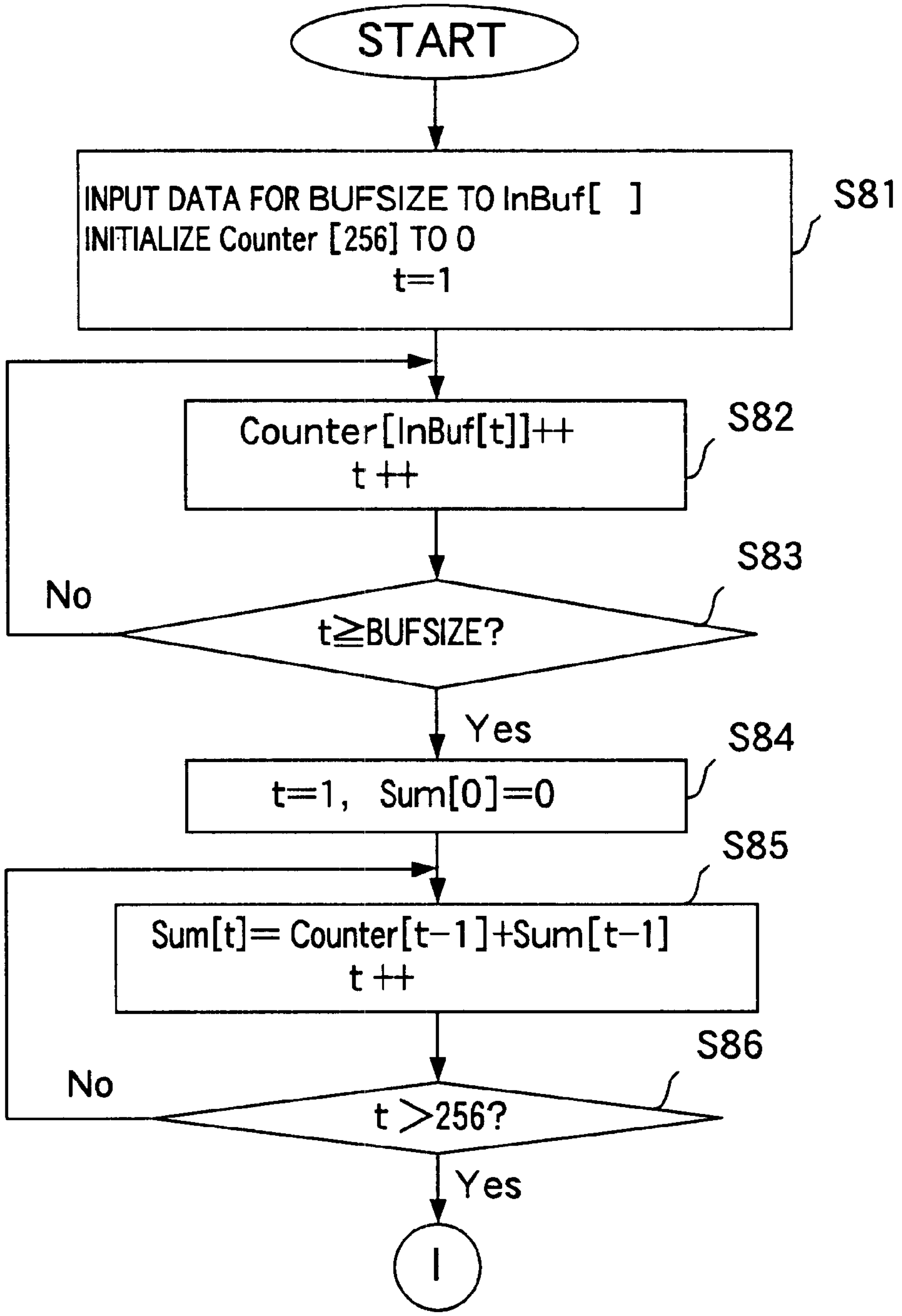
FIG. 17 is a flowchart (No.1) of a rank list generation process.

FIGS. 17 and 18 are flowcharts showing a rank list generation process based on a radix sort. Here, a sort unit 25 of FIG. 5 bin-sorts each character of a prefix of three characters. It is understood experimentally that the longest match retrieval process is economized by sorting prefixes while limiting the characters of a prefix to three characters.

In the bin sort method, the number of appearances of the respective values of 0 to 255 (character codes) is counted, and the number of character codes less than the character codes is calculated. In this way, it is determined at which location of the array each character code that appears should be finally stored.

When data for BUFSIZE is input in the input buffer InBuf [ ], the sort unit 25 initializes the respective elements of an array Counter [256] to 0, and sets a variable t to 1 (step S81).

Next, the sort unit 25 adds 1 to Counter InBuf [t], and increments the number of appearances of a character code held in InBuf [t] (step S82). The unit adds 1 to t, and compares t with BUFSIZE (step S83). If t<BUFSIZE, the sort unit repeats the process in step S82. If t reaches BUFSIZE, the unit sets t=1 and Sum [0]=0 (step S84).

Next, the sort unit 25 sets Sum [t]=Counter [t−1]+Sum [t−1], and adds 1 to t (step S85), so that it compares t with 256 (step S86). Here, Sum [t] indicates the total of the numbers of appearances of the character codes from 0 to t−1. If t≦256, the sort unit 25 repeats the process in step S85. When t exceeds 256, the unit performs the process of FIG. 18.

In FIG. 18, the sort unit 25 performs the bin sort process using the third character of the prefix. In this case, the unit sets t=1, and copies Sum [ ]] into StackP [ ] (step S87). Here, an array A [ ] stores an address sorted by the third character of a character string of which a start point is the address t of InBuf [ ].In the case that the third character is a value x, StackP [x] stores a subscript of the array A [ ] to be stored as a sort result.

Next, the sort unit 25 sets A[StackP[InBuf[t+2]]]=t, adds 1 to StackP [InBuf [t+2]], and adds 1 to t (step S88). Here, StackP [InBuf [t+2]] indicates a subscript of the A [ ] corresponding to the third character of a prefix of which a start point is the address t. A[StackP[InBuf[t+2]]] indicates an address of the prefix. Next, the sort unit 25 compares t with BUFSIZE (step S89), and repeats the process in step S88 if t<BUFSIZE.

When t reaches BUFSIZE, the generated array A [ ] is bin-sorted using the second character of the prefix. In this case, the sort unit 25 first sets t=1, and copies Sum [ ] into StackP [ ] (step S90). Here, the array StackP [ ] stores the subscript of an array B [ ] that stores the sort result. Next, the sort unit 25 sets B [StackP [InBuf A [t+1]]]=t, adds 1 to StackP [InBuf [A[t]+1]], and adds 1 to t (step S91). Here, StackP [InBuf [A [t]+1]] indicates a subscript of B [ ] corresponding to the second character of a prefix stored at the location of the subscript t of the array A[ ]. B [StackP [InBuf [A [t]+1]]] indicates an address of the prefix. Next, the sort unit 25 compares t with BUFSIZE (step S92), and repeats the process in step S91 if t<BUFSIZE.

When t reaches BUFSIZE, the sort unit 25 bin-sorts the generated array B [ ] using the first character of the prefix. In this case, the sort unit 25 first sets t=1, and copies Sum [ ] into StackP [ ] (step S93). Here, the array StackP [ ] stores a subscript (rank number) of the rank list Odr2P [ ] for storing a sort result.

Next, the sort unit 25 sets Odr2P[StackP[InBuf[B [t]]]=t, so that it adds 1 to StackP[InBuf[B [t]], and adds 1 to t (step S94). Here, StackP[InBuf[B [t]] indicates a rank of the first character of the prefix stored at the location of a subscript t of the array B [ ]. Odr2P[StackP[InBuf[B [t]]] indicates an address of the prefix.

Next, the sort unit 25 compares t with BUFSIZE (step S96), and repeats the process in step S94 if t<BUFSIZE. Then, the sort unit 25 terminates processes when t reaches BUFSIZE. In this way, the rank list Odr2P [ ] is generated.

In the above-mentioned embodiments, when the rank list is generated, character strings are sorted by comparing the prefixes of the character strings, each having a fixed length (N characters). Instead, the prefixes, each having a variable length, can be compared also. In the above-mentioned embodiments, the character string retrieval process in the LZ77 encoding is explained. The present invention, however, can apply to the character string retrieval process in an arbitrary encoding technology and is not limited to the LZ77 encoding technology.

Figure 19:
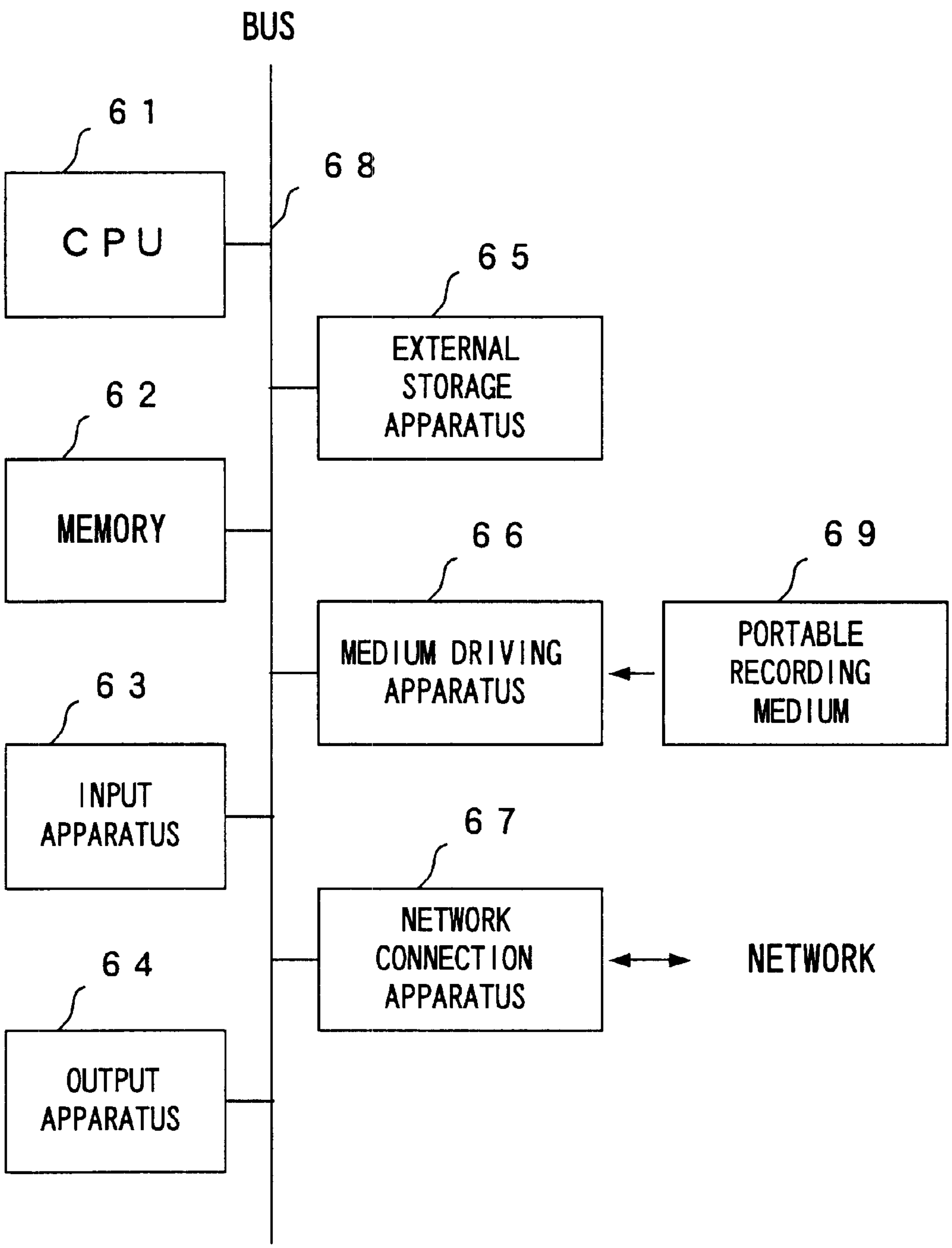
FIG. 19 is a flowchart of the configuration of an information processing apparatus.

The data compression apparatus of FIG. 5 can be configured by using, for example, an information processor (computer) as shown in FIG. 19. An information processor of FIG. 19 is provided with a central processing unit (CPU) 61, memory 62, input apparatus 63, output apparatus 64, external storage apparatus 65, medium drive apparatus 66, and network connection apparatus 67 which are connected with each other by a bus 68.

The memory 62 includes a ROM (read only memory), RAM (random access memory) and the like, and stores programs and data to be used for the processes. The CPU61 performs required processes by executing the programs using the memory 62.

The input buffer 21, appearance location holding unit 26, reverse-rank list 31 of FIG. 6, matching location list 41 of FIG. 10, and hash table 51 of FIG. 14 are installed in the memory 62. The match detection unit 22, code generation unit 23, code output unit 24, and sort unit 25 of FIG. 5; comparison unit 32 of FIG. 6, area detection unit 42 and comparison unit 43 of FIG. 10; and comparison unit 52 and updating unit 53 of FIG. 14 are installed in the memory 62 as a software component described by the programs.

An input apparatus 63 includes, for example, a keyboard, pointing device, touch panel and the like, and it is used to input the instructions and information sent from a user. An output unit 64 includes, for example, a display, printer, loud speaker or the like, and is used to output a query to a user and the process results.

The external storage apparatus 65 includes, for example, a magnetic disk apparatus, optical disk apparatus, magneto-optical disk apparatus, tape apparatus and the like. The information processor stores the above-mentioned programs and data in the external storage apparatus 65, and loads them into the memory 62 to be used as an occasion demands.

The medium drive apparatus 66 drives the portable recording medium 69, and accesses the recorded contents. As the portable recording medium 69, an arbitrary computer readable storage medium such as a memory card, floppy disk, CD ROM (compact disk read only memory), optical disk, magneto-optical disk or the like is used. A user stores the above-mentioned programs and data in the portable recording medium 69, and loads them into the memory 62 to be used as an occasion demands.

The network connection apparatus 67 is connected with an arbitrary communication network such as LAN (Local Area Network) and the like, and converts data at the time of communication. Further, the information processor receives the above-mentioned programs and data through the network connection apparatus 67 from the other apparatuses, and loads them into the memory 62 to be used as an occasion demands.

Figure 20:
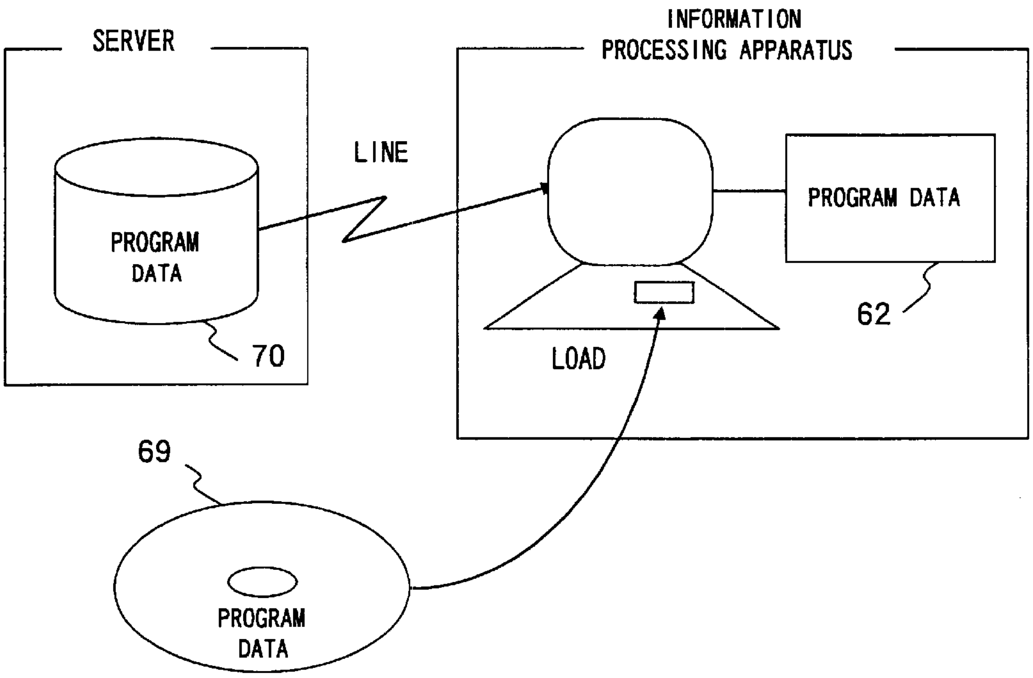
FIG. 20 is a diagram showing a storage medium.

FIG. 20 shows a computer readable storage medium enabling programs and data to be supplied in an information processor of FIG. 19. The programs and data stored in the portable recording medium 69 or a database 71 of a server 70 are loaded into the memory 62. At this time, the server 70 generates a propagation signal for transmitting a program or the like, and sends the signal to the information processor through an arbitrary transmission medium on a network. Then, the CPU 61 executes the programs using the data, and performs a required process.

What is claimed is:

1. A data compression apparatus comprising:

a data storage device storing character string data to be compressed;

a sort device rearranging each character string of which a start point is each of addresses in the data storage device based on contents of each character string;

an appearance location storage device storing address information indicating an address of each character string in an order of rearranged character strings;

a detection device detecting repetition based on the address information stored in the appearance location storage device; and an encoding device encoding and outputting the detected repetition.

2. The data compression apparatus according to claim 1 wherein the sort device rearranges character strings using a prefix of a predetermined number of characters included in each of the character strings.

3. The data compression apparatus according to claim 2 wherein the sort device rearranges character strings using a prefix of three characters included each of the character strings.

4. The data compression apparatus according to claim 2 wherein the sort device rearranges character strings in such a way that a plurality of same prefixes adjoin each other.

5. The data compression apparatus according to claim 2 wherein the sort device rearranges character strings using a radix sort method.

6. The data compression apparatus according to claim 2 wherein the sort device rearranges character strings using a quick sort method.

7. The data compression apparatus according to claim 1 further comprising a reverse rank unit storing information to obtain a rank of an address of each character string in the appearance location storage device from an address of the character string to be encoded, wherein the detection device sets as a matching candidate a character string corresponding to address information stored in a higher rank than a rank obtained by using the reverse rank device, and compares the character string to be encoded with the matching candidate, thereby obtaining a matching length, and the encoding device encodes the character string to be encoded using information indicating a location of the matching candidate and the matching length.

8. The data compression apparatus according to claim 1 further comprising a matching location storage device storing address information of a character string, which is the same as each character string and appears latest, corresponding to an address of each character string, wherein the detection device generates address information to be stored in the matching location storage device from address information stored in the appearance location storage device, compares address information with adjoining address information in the matching location storage device, and detects a continuation area where address information continuously changes, and the encoding device sets a character string corresponding to a location of the continuation area as a character string to be encoded, and encodes the character string to be encoded using address information stored in the continuation area and a length of the continuation area.

9. The data compression apparatus according to claim 8 wherein when the detection device focuses on a rank of the appearance location storage device, and a prefix of a character string in the focused-on rank is identical with a prefix of a character string in a rank one higher than the focused-on rank, the detection device stores address information stored in the rank one higher at a location in the matching location storage device which corresponds to address information stored in the focused-on rank.

10. The data compression apparatus according to claim 8 wherein the detection device detects a part where two or more continuation areas are connected in the matching location storage device and obtains character strings of a plurality of matching candidates based on address information stored in the two or more continuation areas, and the encoding device encodes the character string to be encoded using information indicating a location of a matching candidate with a longest matching length among the plurality of matching candidates and also using the longest matching length.

11. The data compression apparatus according to claim 1 further comprising a retrieval device storing information to obtain a rank of a character string, that includes a same prefix as a prefix of a predetermined number of characters included in a character string to be encoded, in the appearance location storage device from the prefix of the predetermined number of characters, wherein the detection device sets as a matching candidate a character string corresponding to address information stored in the rank obtained by using the retrieval device, and compares the character string to be encoded with the matching candidate to obtain a matching length, and the encoding device encodes the character string to be encoded using information indicating a location of the matching candidate and the matching length.

12. The data compression apparatus according to claim 11 wherein the detection device updates information stored in the retrieval device so that a rank obtained from the retrieval device corresponding to a prefix of the predetermined number of character strings is made to be a rank of a character string including the same prefix that appears latest.

13. A computer readable storage medium recording a program for a computer, the program causing the computer to perform:

rearranging each character string of which a start point is each of addresses in character string data to be compressed, based on contents of each character string;

recording address information indicating an address of each character string in an order of the rearranged character strings;

detecting repetition based on the recorded address information; and encoding the detected repetition.

14. A data compression method comprising:

rearranging each character string of which a start point is each of addresses in character string data to be compressed, based on contents of each character string;

recording address information indicating an address of each character string, in an order of the rearranged character strings;

detecting repetition based on the recorded address information; and encoding the detected repetition.

15. A data compression apparatus comprising:

data storage means for storing character string data to be compressed;

sort means for rearranging each character string of which a start point is each of addresses in the data storage means, based on contents of each character string;

appearance location storage means for storing address information indicating an address of each character string in an order of the rearranged character strings;

detection means for detecting repetition based on the address information stored in the appearance location storage means; and encoding means for encoding and outputting the detected repetition.

16. A propagation signal propagating a program to a computer, the program causing the computer to perform:

rearranging each character string of which a start point is each of addresses in character string data to be compressed, based on contents of each character string;

recording address information indicating an address of each character string, in an order of the rearranged character strings;

detecting repetition based on the recorded address information; and encoding the detected repetition.

* * * * *

UNITED STATES PATENT AND TRADEMARK OFFICE

CERTIFICATE OF CORRECTION

PATENT NO. : 6,392,567 B2 
DATED : May 21, 2002
INVENTOR(S) : Noriko Satoh

It is certified that error appears in the above-identified patent and that said Letters Patent is hereby corrected as shown below:

Title page,
Item [73], Assignee, change "Fijitsu Limited" to -- Fujitsu Limited --

Signed and Sealed this

Twenty-first Day of December, 2004

JON W. DUDAS
*Director of the United States Patent and Trademark Office*